US011699732B2

United States Patent
Sun et al.

(10) Patent No.: US 11,699,732 B2
(45) Date of Patent: *Jul. 11, 2023

(54) METHOD FOR FORMING MEMORY DEVICE COMPRISING BOTTOM-SELECT-GATE STRUCTURE

(71) Applicant: Yangtze Memory Technologies Co., Ltd., Wuhan (CN)

(72) Inventors: Zhongwang Sun, Wuhan (CN); Zhong Zhang, Wuhan (CN); Lei Liu, Wuhan (CN); Wenxi Zhou, Wuhan (CN); Zhiliang Xia, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 35 days.

This patent is subject to a terminal disclaimer.

(21) Appl. No.: 17/445,434

(22) Filed: Aug. 19, 2021

(65) Prior Publication Data

US 2021/0384309 A1    Dec. 9, 2021

Related U.S. Application Data

(60) Division of application No. 16/918,259, filed on Jul. 1, 2020, now Pat. No. 11,183,575, which is a
(Continued)

(51) Int. Cl.
*H01L 29/423*        (2006.01)
*H01L 21/28*         (2006.01)
(Continued)

(52) U.S. Cl.
CPC .. *H01L 29/42372* (2013.01); *H01L 29/40114* (2019.08); *H01L 29/40117* (2019.08); *H10B 41/41* (2023.02); *H10B 43/40* (2023.02)

(58) Field of Classification Search
CPC ......... H01L 29/42372; H01L 27/11529; H01L 27/11573; H01L 29/40114;
(Continued)

(56) References Cited

U.S. PATENT DOCUMENTS

2009/0104786 A1    4/2009  Narita
2016/0148947 A1*   5/2016  Seo .................. H01L 27/11582
                                                        257/324
(Continued)

FOREIGN PATENT DOCUMENTS

| CN | 107731842 A | 2/2018 |
| CN | 108028255 A | 5/2018 |
| CN | 109690776 A | 4/2019 |
| CN | 110914990 A | 3/2020 |
| TW | 201421651 A | 6/2014 |
| TW | 201943041 A | 11/2019 |

*Primary Examiner* — Duy T Nguyen
(74) *Attorney, Agent, or Firm* — Anova Law Group, PLLC

(57) ABSTRACT

Memory device includes a bottom-select-gate (BSG) structure formed on a substrate. Cut slits are formed vertically through the BSG structure. A cell-layers structure is formed on the BSG structure. Gate-line slits are formed vertically through the cell-layers structure and the BSG structure, into the substrate and arranged along a first lateral direction to distinguish finger regions. The gate-line slits include a first gate-line slit between first and second finger regions, the first gate-line slit including gate-line sub-slits. The cut slits include a first cut-slit, formed in the second finger region and connecting to a gate-line sub-slit to define a BSG in a first portion of the second finger region. The BSG in the first portion of the second finger region is electrically connected to cell strings in the first finger region through an inter portion between the one gate-line sub-slit and an adjacent gate-line sub-slit.

14 Claims, 17 Drawing Sheets

Related U.S. Application Data continuation of application No. PCT/CN2020/092081, filed on May 25, 2020.

(51) Int. Cl.
    *H10B 41/41*     (2023.01)
    *H10B 43/40*     (2023.01)

(58) Field of Classification Search
    CPC ......... H01L 29/40117; H01L 27/11565; H01L 27/1157; H01L 27/11575; H01L 27/11582; H10B 41/41; H10B 43/40; H10B 43/27; H10B 43/50; H10B 43/35; H10B 43/10
    USPC ........................................................ 438/156
    See application file for complete search history.

(56) References Cited

U.S. PATENT DOCUMENTS

| | | | |
|---|---|---|---|
| 2017/0352669 A1* | 12/2017 | Sharangpani | H01L 23/53266 |
| 2019/0043883 A1 | 2/2019 | Xu et al. | |
| 2019/0096901 A1* | 3/2019 | Dai | H01L 27/11573 |
| 2019/0371811 A1 | 12/2019 | Oike | |
| 2020/0273873 A1* | 8/2020 | Hua | H01L 27/11582 |
| 2020/0395376 A1* | 12/2020 | Huo | H01L 27/11582 |
| 2021/0057429 A1* | 2/2021 | Zhang | H01L 27/11556 |
| 2021/0111079 A1* | 4/2021 | Shi | H01L 29/1037 |

\* cited by examiner

METHOD FOR FORMING MEMORY DEVICE COMPRISING BOTTOM-SELECT-GATE STRUCTURE

CROSS-REFERENCE TO RELATED APPLICATION

This application is a divisional of U.S. patent application Ser. No. 16/918,259, filed on Jul. 1, 2020, now U.S. Pat. No. 11,183,575, issued on Nov. 23, 2021, which is a continuation of International Application No. PCT/CN2020/092081, filed on May 25, 2020, the entire content of which is incorporated herein by reference.

FIELD

This application generally relates to the field of memory technologies and, more specifically, to method for forming memory device.

BACKGROUND

Staircase structures are often used in 3-dimensional memory devices, such as NAND memory devices. A staircase structure may include many stairs of electrodes. Vertical contacts may be formed on the stairs to electrically connect to corresponding electrodes. Bottom select gates are electrodes used to select NAND strings and stairs of bottom select gates are at a bottom of a staircase structure.

SUMMARY

One aspect of the present disclosure includes a memory device. The memory device includes a bottom-select-gate (BSG) structure, including cut slits formed vertically through the BSG structure, on a substrate. A cell-layers structure is formed on the BSG structure. Gate-line slits are formed vertically through the cell-layers structure and the BSG structure, into the substrate and arranged along a first lateral direction to distinguish a plurality of finger regions. The gate-line slits include a first gate-line slit between first and second finger regions of the plurality of finger regions, the first gate-line slit including gate-line sub-slits. The cut slits include a first cut-slit, formed in the second finger region and connecting to a gate-line sub-slit of the first gate-line slit to define a BSG in a first portion of the second finger region. The BSG in the first portion of the second finger region is electrically connected to cell strings in the first finger region through an inter portion between the one gate-line sub-slit and an adjacent gate-line sub-slit of the first gate-line slit.

Optionally, the first cut-slit electrically separates the BSG in the first portion of the second finger region from a BSG in a second portion of the second finger region. The BSG in the second portion of the second finger region is electrically connected to cell strings in the second finger region. The BSG in the first portion of the second finger region and the BSG in the second portion of the second finger region have a same height from the substrate.

Optionally, the cut slits further include one or more second cut-slits, each connecting adjacent gate-line sub-slits in a same gate-line slit.

Optionally, the memory device further includes dummy channels, formed in the plurality of finger regions over the substrate; and contacts, formed on BSGs of the BSG structure in the plurality of finger regions excluding the first finger region.

Optionally, the first finger region is defined between a continuous gate-line slit and the first gate-line slit including the gate-line sub-slits. A wall structure is formed in the first finger region over the substrate. The wall structure includes a stack structure of alternating electrode/insulating layer pairs.

Optionally, an orthogonal projection of the cut slits on the substrate includes straight-line segments.

Optionally, the memory device further includes another BSG structure. The substrate includes a staircase-structure region and a doped well is formed in the staircase-structure region of the substrate. The BSG structure and the another BSG structure are formed on the staircase-structure region of the substrate and on opposite sides of the doped well. A top of the BSG structure and a top of the another BSG structure have different heights from the substrate. The substrate further includes a first array region and a second array region, and the staircase-structure region is between the first array region and the second array region, arranged along a second lateral direction.

Optionally, the cell-layers structure includes a stack structure of alternating electrode/insulating layer pairs.

Optionally, a word line in the second finger region over the BSG structure is connected to an electrode layer in the first finger region through the inter portion between the one gate-line sub-slit and the adjacent gate-line sub-slit of the first gate-line slit.

Optionally, the memory device further includes an insulating material formed in the cut slits.

Another aspect of the present disclosure includes a method for forming a memory device. A bottom-select-gate (BSG) structure is formed on a substrate. Cut slits are formed vertically through the BSG structure on the substrate. A cell-layers structure is formed on the BSG structure. Gate-line slits are formed, vertically through the cell-layers structure and the BSG structure, into the substrate and arranged along a first lateral direction to distinguish a plurality of finger regions. The gate-line slits include a first gate-line slit between first and second finger regions of the plurality of finger regions, the first gate-line slit including gate-line sub-slits. The cut slits include a first cut-slit, formed in the second finger region and connecting to a gate-line sub-slit of the first gate-line slit to define a BSG in a first portion of the second finger region. The BSG in the first portion of the second finger region is electrically connected to cell strings in the first finger region through an inter portion between the one gate-line sub-slit and an adjacent gate-line sub-slit of the first gate-line slit.

Optionally, the first cut-slit electrically separates the BSG in the first portion of the second finger region from a BSG in a second portion of the second finger region.

Optionally, the BSG in the second portion of the second finger region is electrically connected to cell strings in the second finger region. The BSG in the first portion of the second finger region and the BSG in the second portion of the second finger region have a same height from the substrate. The cut slits further include one or more second cut-slits, each connecting adjacent gate-line sub-slits in a same gate-line slit.

Optionally, dummy channels are formed in the plurality of finger regions over the substrate; and contacts are formed on BSGs in the plurality of finger regions excluding the first finger region.

Optionally, the first finger region is defined between a continuous gate-line slit and the first gate-line slit including the gate-line sub-slits. A wall structure is formed in the first finger region over the substrate. The wall structure includes a stack structure of alternating electrode/insulating layer pairs.

Optionally, an orthogonal projection of the cut slits on the substrate includes straight-line segments.

Optionally, another BSG structure is formed. The substrate includes a staircase-structure region and a doped well is formed in the staircase-structure region of the substrate. The BSG structure and the another BSG structure are formed on the staircase-structure region of the substrate and on opposite sides of the doped well. A top of the BSG structure and a top of the another BSG structure have different heights from the substrate. The substrate further includes a first array region and a second array region, and the staircase-structure region is between the first array region and the second array region, arranged along a second lateral direction.

Optionally, the cell-layers structure includes a stack structure of alternating sacrificial layer/insulating layer pairs before forming the gate-line slits.

Optionally, a word line in the second finger region over the BSG structure is connected to an electrode layer in the first finger region through the inter portion between the one gate-line sub-slit and the adjacent gate-line sub-slit of the first gate-line slit.

Optionally, an insulating material is deposited in the cut slits.

Other aspects of the present disclosure can be understood by those skilled in the art in light of the description, the claims, and the drawings of the present disclosure.

DETAILED DESCRIPTION OF EMBODIMENTS

The following describes the technical solutions in the embodiments of the present invention with reference to the accompanying drawings. Wherever possible, the same reference numbers will be used throughout the drawings to refer to the same or like parts. Apparently, the described embodiments are merely some but not all the embodiments of the present invention. Other embodiments obtained by a person skilled in the art based on the embodiments of the present invention without creative efforts shall fall within the protection scope of the present disclosure.

In the specification, claims, and accompanying drawings of the present disclosure, the terms "first," "second," "third," "fourth," and the like (if exist) are intended to distinguish between similar objects but do not necessarily indicate an order or sequence. It should be understood that the embodiments of the present disclosure described herein can be implemented, for example, in orders other than the order illustrated or described herein.

Some or all of the processes may be chosen according to actual needs to achieve purposes of the present disclosure. Some or all of the components may be chosen according to actual needs to achieve purposes of the present disclosure.

The terms "one or more" or the like as used herein may be used to describe any feature, structure, or characteristic in a singular sense and/or may be used to describe combinations of features, structures or characteristics in a plural sense. Similarly, terms "a," "an," and "the," or the like may be used to convey a singular usage and/or to convey a plural usage.

It should be understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatial terms "beneath," "below," "lower," "above," "upper," "top," "bottom," and the like, may be used herein for ease of description to describe one element or feature's relationship to another element(s) or feature(s) as illustrated in the figures. The spatial terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
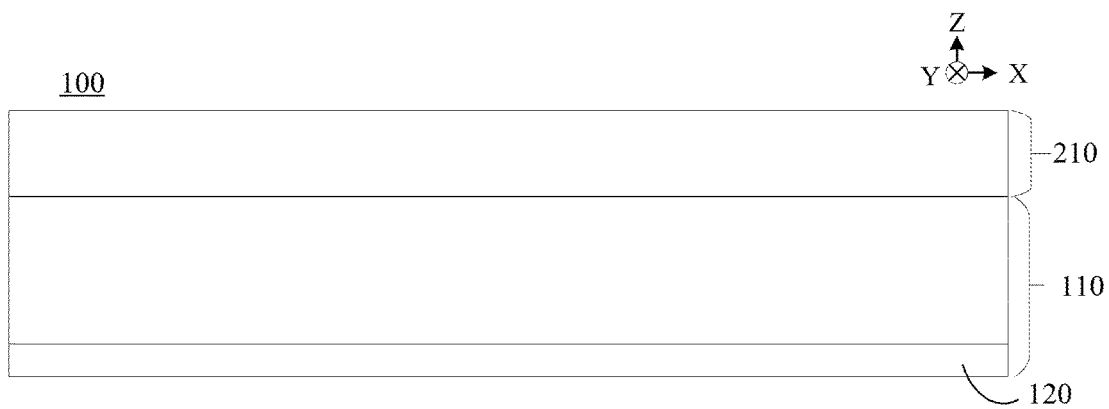
FIG. 1 illustrates a schematic view of an exemplary three-dimensional (3D) memory device according to various embodiments of the present disclosure.
Figure 2:
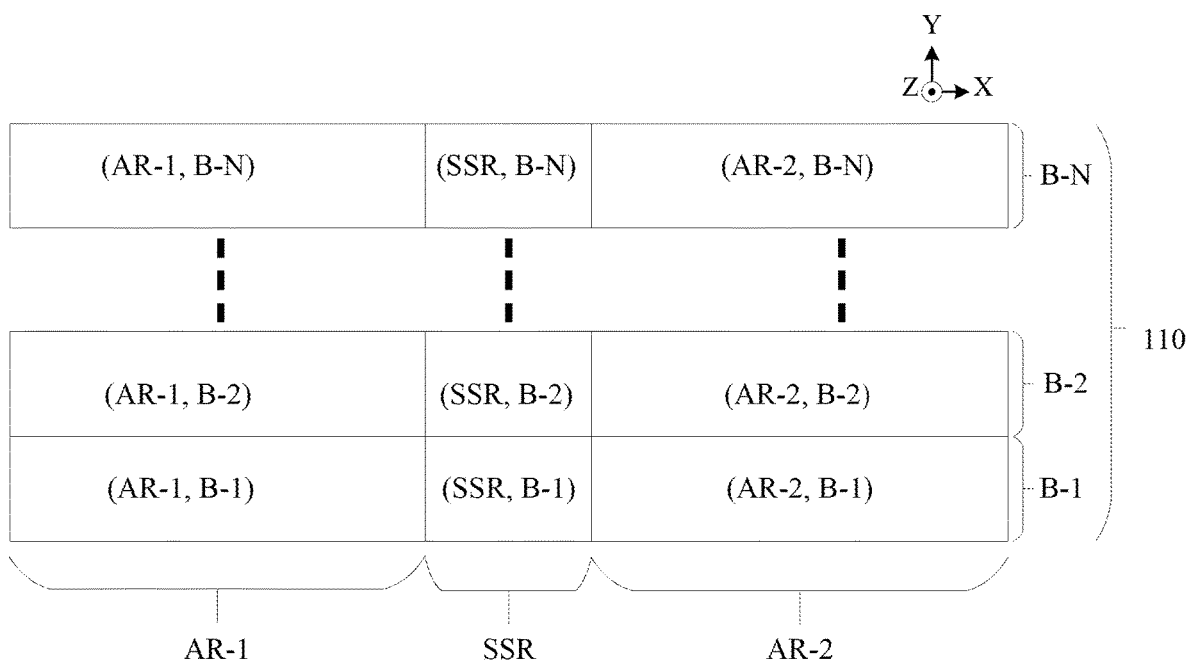
FIG. 2 illustrates a schematic view of a first semiconductor structure of an exemplary 3D memory device according to various embodiments of the present disclosure.
Figure 3:
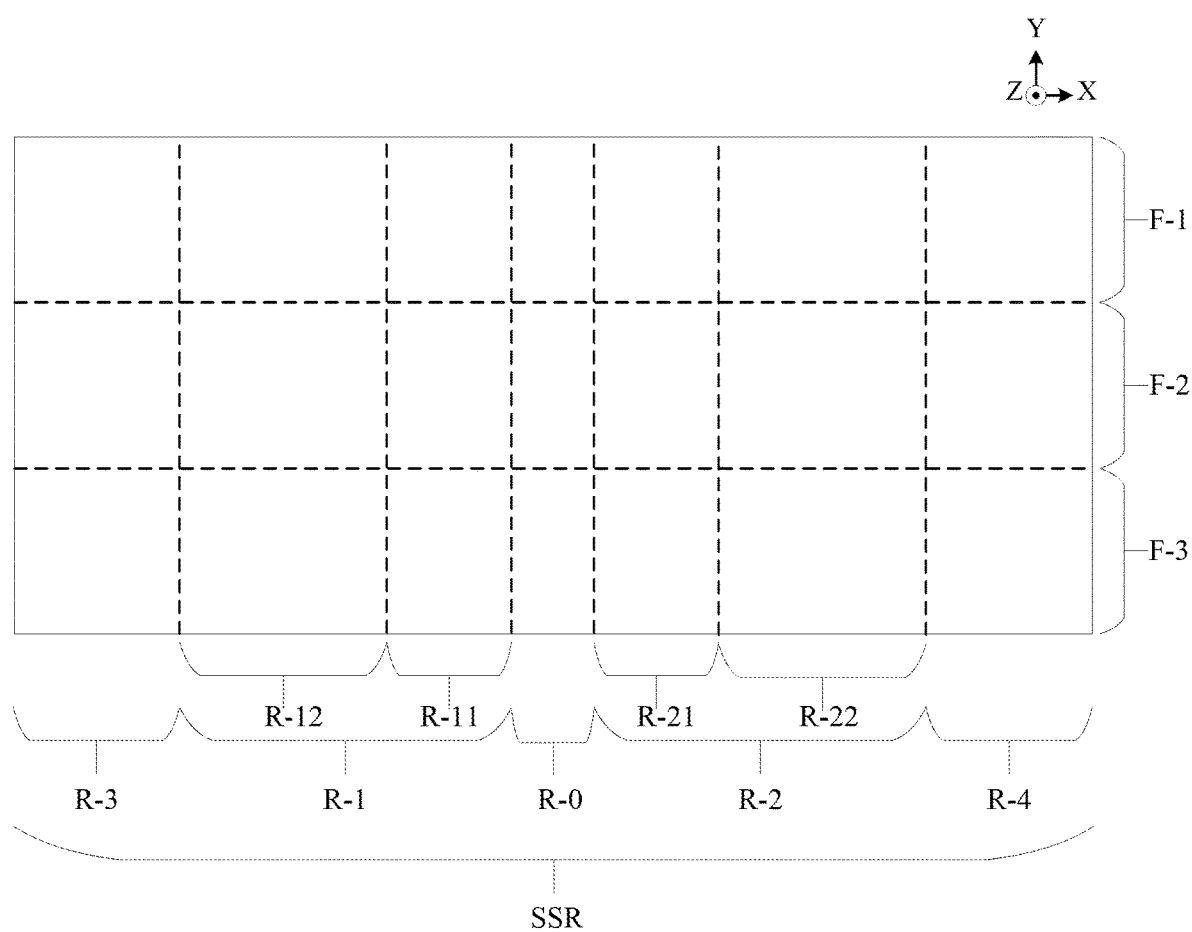
FIG. 3 illustrates an exemplary staircase-structure region in a block of an 3D memory device according to various embodiments of the present disclosure.
Figure 4:
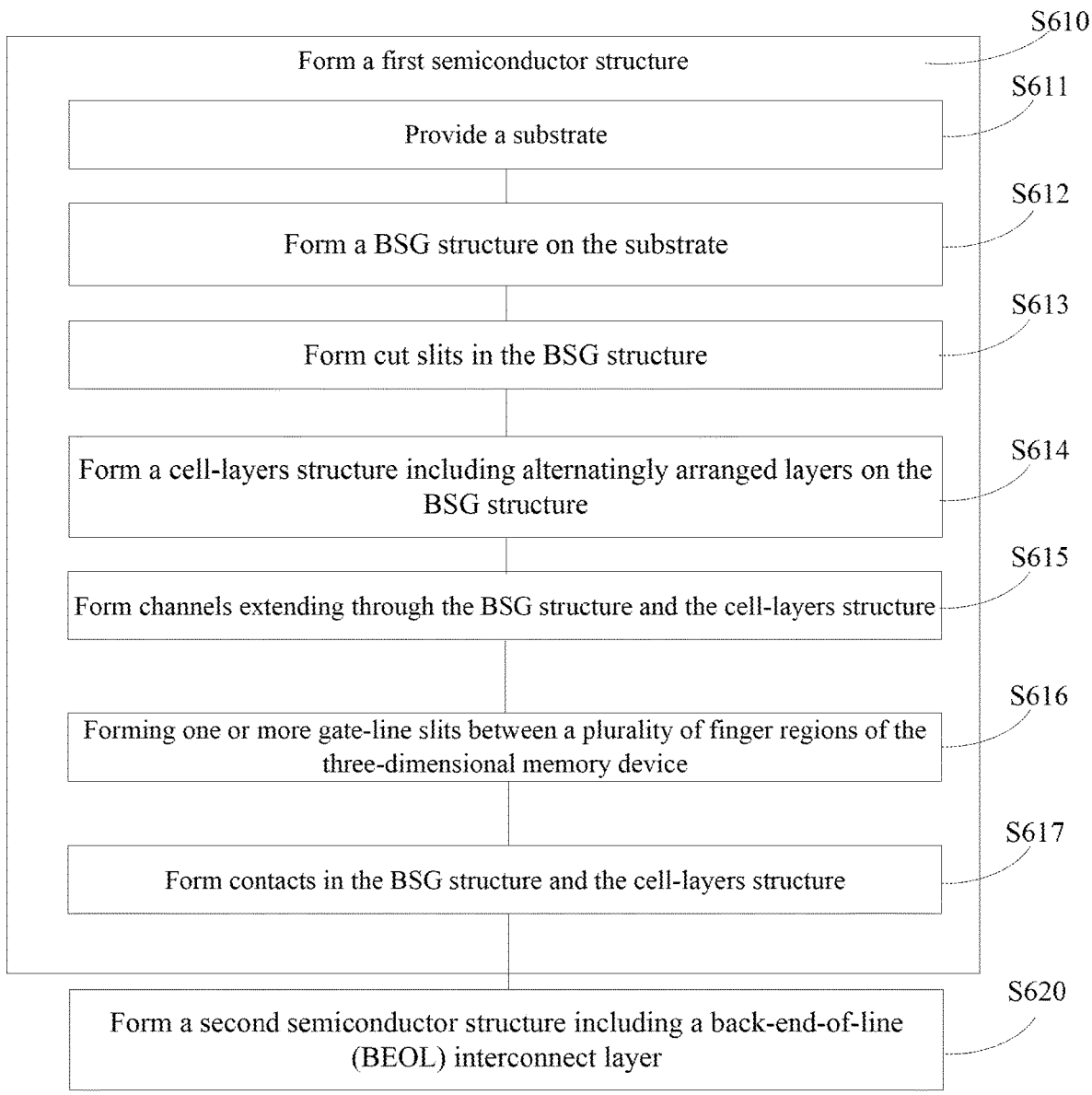
FIG. 4 illustrates a flowchart of an exemplary method for forming a three-dimensional memory device according to various embodiments of the present disclosure.
Figure 25:
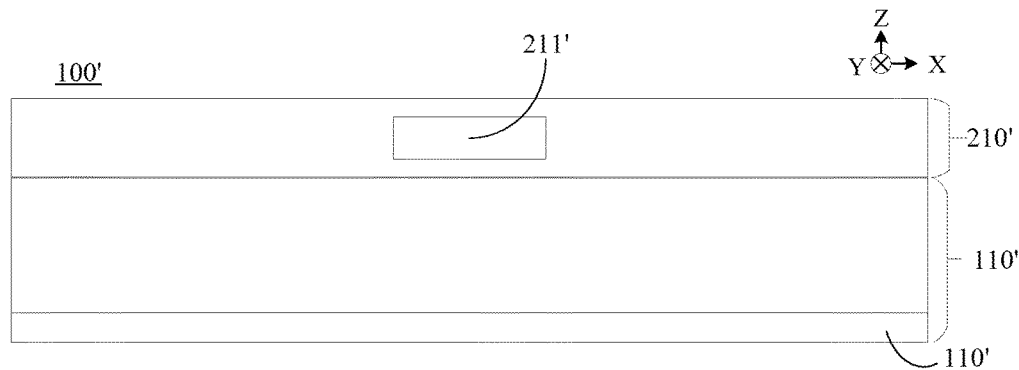
FIG. 25 illustrates another exemplary 3D memory device according to various embodiments of the present disclosure.
Figure 26:
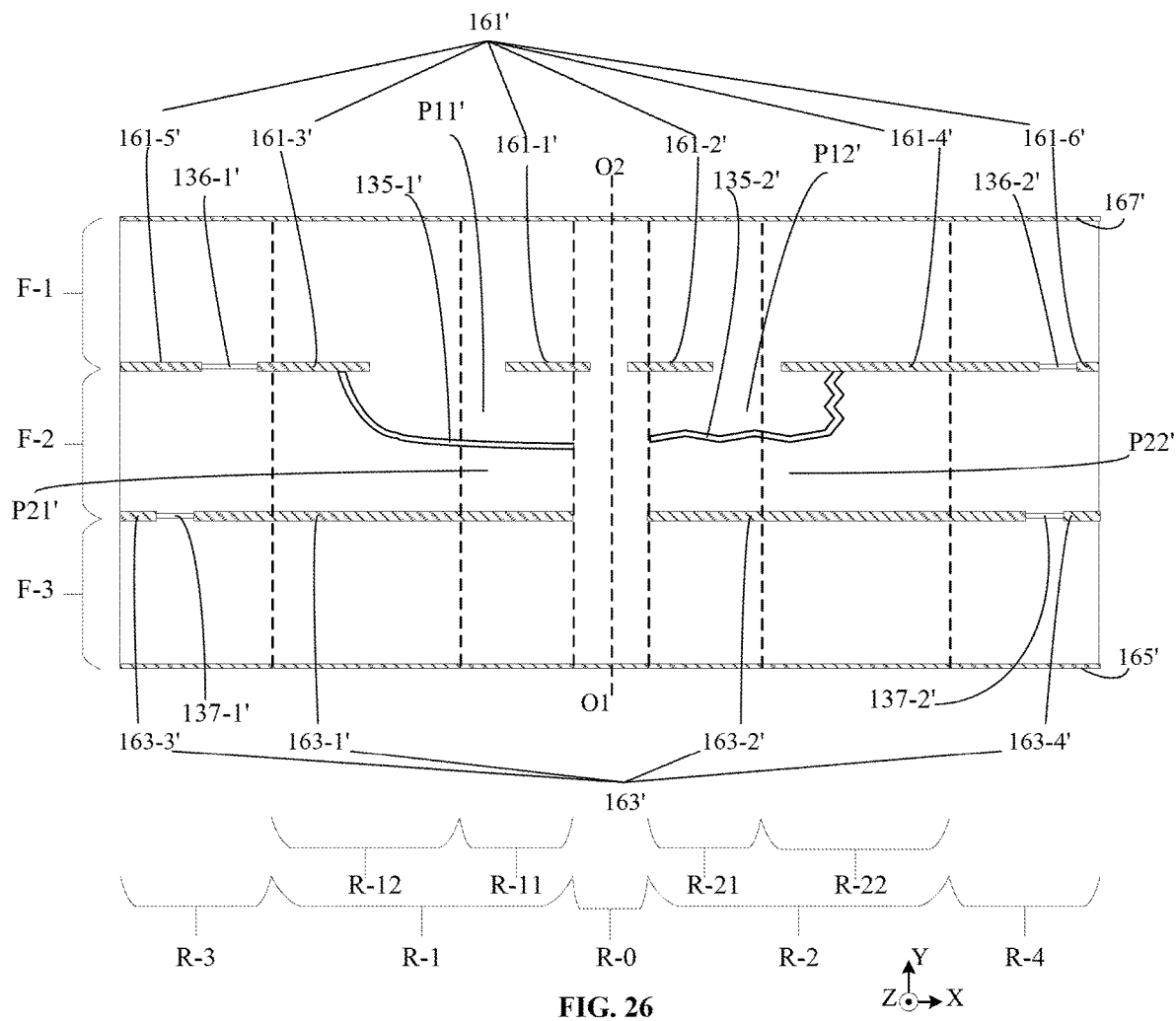
FIG. 26 illustrates another schematic view of orthogonal projections of gate-line slits and cut slits of a 3D memory device and in a staircase-structure region according to various embodiments of the present disclosure.

The present disclosure provides a three-dimensional (3D) memory device and a method for forming the same. FIG. 1 illustrates a schematic view of an exemplary three-dimensional (3D) memory device according to various embodiments of the present disclosure. FIG. 2 illustrates a schematic view of a first semiconductor structure of an exemplary 3D memory device according to various embodiments of the present disclosure. FIG. 3 illustrates an exemplary staircase-structure region in a block of an 3D memory device according to various embodiments of the present disclosure. FIG. 4 illustrates a flowchart of an exemplary method for forming a 3D memory device. FIGS. 5 to 24 illustrate schematic views of structures at certain stages of forming an exemplary 3D memory device. For example, FIGS. 5 to 15 and 17 to 23 illustrate schematic views of structures of an exemplary 3D memory device and in a staircase-structure region, and FIG. 16 illustrates a schematic view of structures in an exemplary array region. FIG. 25 illustrates another exemplary 3D memory device according to various embodiments of the present disclosure. FIG. 26 illustrates another schematic view of orthogonal projections of gate-line slits and cut slits of a 3D memory device and in a staircase-structure region on the substrate.

FIG. 1 illustrates a schematic view of an exemplary three-dimensional (3D) memory device according to various embodiments of the present disclosure. A 3D memory device 100 includes a first semiconductor structure 110 and a second semiconductor structure 210. The first semiconductor structure 110 may include a substrate 120. A first direction in or parallel to a surface plane of the substrate is denoted as X direction. A second direction in or parallel to a surface plane of the substrate is denoted as Y direction, and a symbol near letter "Y" and showing a combination of a circle and a cross indicates that Y direction in FIG. 1 points inward with respect to the drawing sheet of the figure. A third direction that is normal to the surface plane of the substrate is denoted as Z direction.

A vertical direction with respect to the substrate may be a direction along the third direction (e.g., Z direction). A lateral or horizontal direction with respect to the substrate may be a direction (e.g., X and/or Y direction) that is parallel to the surface plane of the substrate. A lateral or horizontal plane may be a plane that is parallel to the surface plane of the substrate.

The first semiconductor structure 110 may include memory cells, word lines, contacts, channels, bottom select gates, top select gates, staircases, etc. A staircase may include one or more stairs or stairsteps. A bottom select gate can also be referred to as a "bottom-select-gate" or a "BSG". A top select gate can also be referred to as a "top-select-gate" or a "TSG". The second semiconductor device 210 may include back-end-of-line interconnect layer. In some embodiments, the second semiconductor structure 210 may be directly formed on the first semiconductor structure 110. In other embodiments, the second semiconductor structure 210 may be formed separately with respected to the first semiconductor structure 110, and further bonded with the first semiconductor structure 110.

FIG. 2 illustrates a schematic top view of a first semiconductor structure of an exemplary 3D memory device according to various embodiments of the present disclosure. For example, first semiconductor structure 110 may include one or more blocks, such as block B-1, block B-2, and so on. Block B-N indicates Nth block, where N may be a positive integer. The blocks may be arranged along Y direction and each may extend along X direction. Each block of the first semiconductor structure 110 may include a first array region, denoted as "AR-1," a second array region, denoted as "AR-2," and a staircase-structure region, denoted as "SSR," which is a central region between the first array region and the second array region in each block and include stairs. A region in both AR-1 and B-1, i.e. a first array region in block B-1, is denoted as region (AR-1, B-1). A region in both SSR and B-1, i.e., a staircase-structure region in block B-1, is denoted as region (SSR, B-1). A region in both AR-2 and B-1, i.e. a second array region in block B-1, is denoted as region (AR-2, B-1). A region in both AR-1 and B-N, i.e. a first array region in block B-N, is denoted as region (AR-1, B-N).

FIG. 3 illustrates an exemplary staircase-structure region in a block of an 3D memory device according to various embodiments of the present disclosure. The staircase-structure region may include a doped well region, denoted as region "R-0"; a first BSG region, denoted as region "R-1"; a second BSG region, denoted as region "R-2"; a first word-line-stair region, denoted as region "R-3"; a second word-line-stair region, denoted as region "R-4". Regions R-0, R-1, R-2, R-3, and R-4 may extend from the substrate 110 in Z direction from the substrate or from a position inside the substrate. One or more stairs for bottom select gates may be formed in regions R-1 and R-2; and one or more stairs for word lines and/or top select gates may be formed in regions R-3 and R-4. Region R1 may include a first sub-region R-11 and a second sub-region R-12. Region R2 may include a first sub-region R-21 and a second sub-region R-22. Regions F-1, F-2, F-3 are a first finger region, a second finger region, and a third finger region of a block in the 3D memory device, respectively. Region (R-1, F-1) refers to a region in both the first finger region and the first BSG region, i.e., an overlapped region of the first finger region and the first BSG region. Region (R-m, F-n) refers to a region in region R-m and region F-n, i.e., an overlapped region of region R-m and region F-n, where m and n are suitable numbers, such as positive integers. For example, if m=2 and n=3, region (R-m, F-n) is region (R-2, F-3), which is a region in both region R-2 and region F-3, i.e., an overlapped region of region R-2 and region F-3.

In some embodiments, the staircase-structure region (SSR) may include a first word-line-stair region (R-3) that includes word-line stairs, a first BSG region (R-1) that includes bottom select gates and BSG stairs, a doped well region (R-0) that includes a doped well, a second BSG region (R-2) that include bottom select gates and BSG stairs, and a second word-line-stair region (R-4) that includes word-line stairs. The first word-line-stair region (R-3), the first BSG region (R-1), the doped well region (R-0), the second BSG region (R-2), and the second word-line-stair region (R-4) may be, for example, arranged along the first direction from one region to another region, and may each extend along the first direction and/or the second direction.

In the present disclosure, the number of finger regions in a block may be chosen according to various application scenarios. The number of finger regions may be, for example, 2, 3, 4, or any other suitable numbers.

FIG. 4 illustrates a flowchart of an exemplary method for forming a 3D memory device according to various embodiments of the present disclosure. Referring to FIG. 4, a first semiconductor structure is formed (S610).

For forming the first semiconductor structure, a substrate is provided (S611). Correspondingly, FIG. 5 illustrates a schematic view of a substrate of an exemplary 3D memory device according to various embodiments of the present disclosure.

Figure 5:
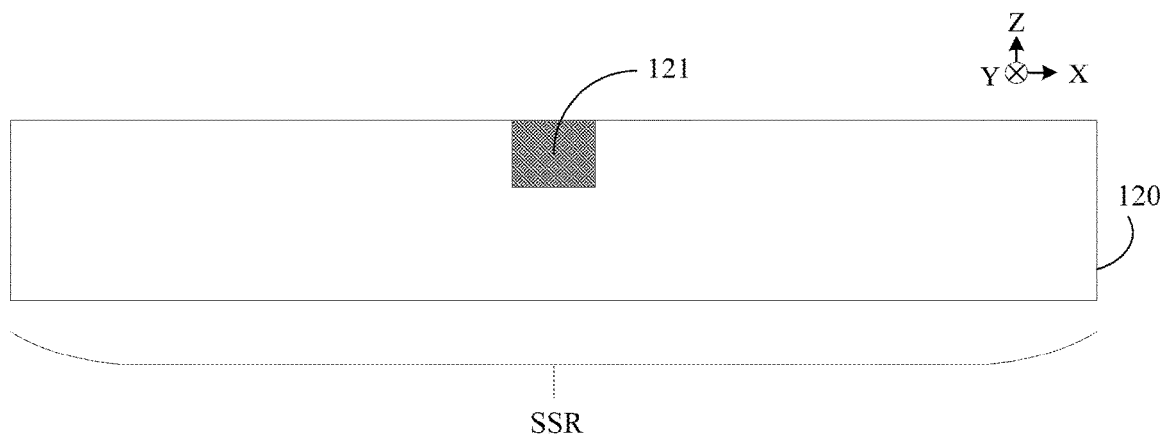
FIG. 5 illustrates a schematic view of a substrate of an exemplary 3D memory device according to various embodiments of the present disclosure.

In FIG. 5, the substrate 120 includes a doped well 121. The doped well 121 may extend along Y direction. The substrate 120 may include silicon, such as single-crystalline silicon, silicon germanium, gallium arsenide, germanium (Ge), or any other suitable materials. The doped well 121 may be fully or partially doped with n-type and/or p-type dopants. The doped well may be, for example, a p-well, i.e., a well doped with p-type dopants, or a n-well, a well doped with n-type dopants. For illustrative purposes, only structures in region SSR are partially shown in FIG. 5. The substrate may include other regions, such as array regions AR-1 and AR-2.

Returning to FIG. 4, a bottom-select-gate (BSG) structure is formed on the substrate (S612). Correspondingly, FIGS. 6 to 9 show structures at certain stages during a process of forming the BSG structure.

Figure 6:
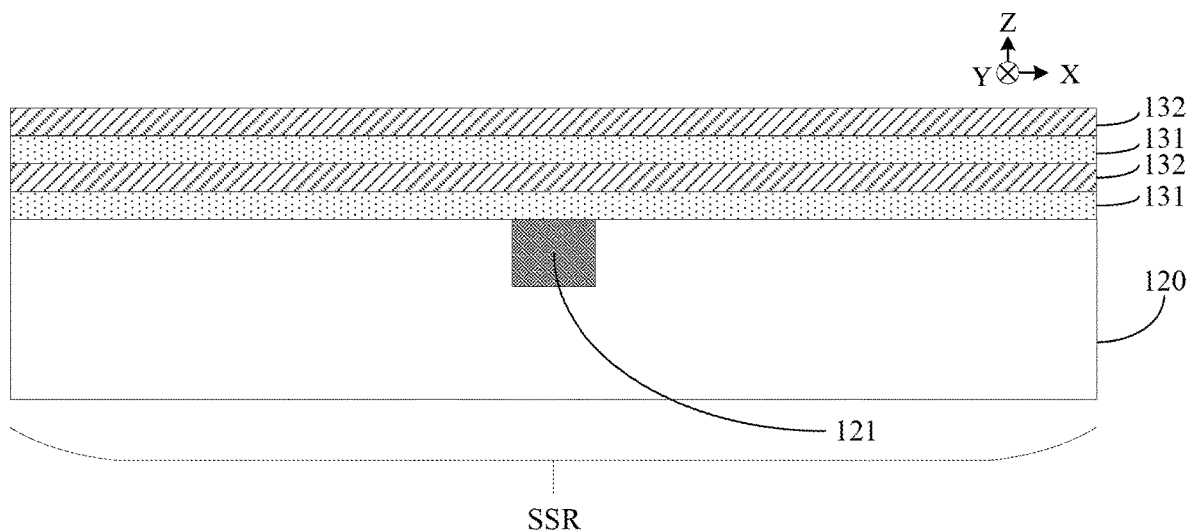
FIGS. 6 to 9 show structures at certain stages during a process of forming a bottom-select-gate (BSG) structure according to various embodiments of the present disclosure.

Referring to FIG. 6, a stack structure including alternatingly arranged sacrificial layers 132 and insulating layers 131 for the BSG structure is formed on the substrate 120. An insulating layer 131 and an adjacent sacrificial layer 132 form a tier or a pair, such as an insulating layer/sacrificial layer pair. The pairs may be at different heights with respect to a reference surface, e.g., a substrate surface. In some embodiments, each pair may have a same thickness. In other embodiments, each pair may have different thicknesses.

In some embodiments, the sacrificial layer may include, for example, poly-silicon, poly-germanium, and/or silicon nitride. In some embodiments, the insulating layer may include, for example, an oxide material, such as silicon oxide.

In some embodiments, the sacrificial layer may include any suitable material different from the insulating layer. For example, the sacrificial layer may be nitride, the insulating layer may be oxide, and the sacrificial layer/insulating layer pair may be a nitride-oxide pair.

The number of pairs may be chosen according to various application scenarios. The number of pairs may be, for example, 1, 2, 3, 4, or any other suitable numbers.

In some embodiments, the stack structure may include one or more sacrificial layer/insulating layer pairs, and may further include a bottom insulating layer and/or a top insulating layer. For example, the stack structure may include a bottom insulating layer and one or more sacrificial layer/insulating layer pairs, and the bottom insulating layer is in contact with a sacrificial layer of an adjacent pair. In some embodiments, in a sacrificial layer/insulating layer pair, the sacrificial layer may be above the insulating layer. In other embodiments, in a sacrificial layer/insulating layer pair, the insulating layer may be above the sacrificial layer.

Figure 7:
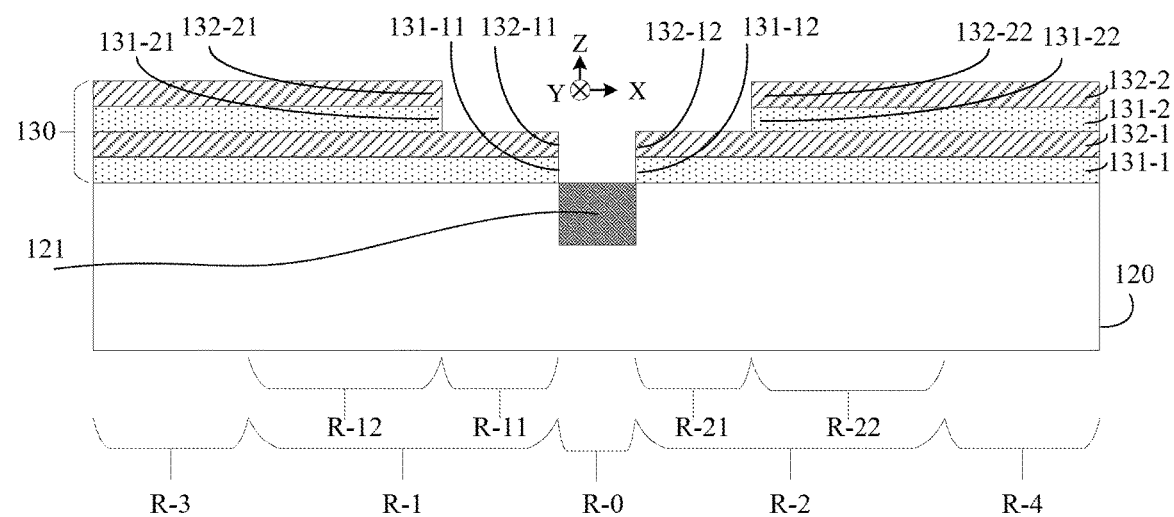
Figure 8:
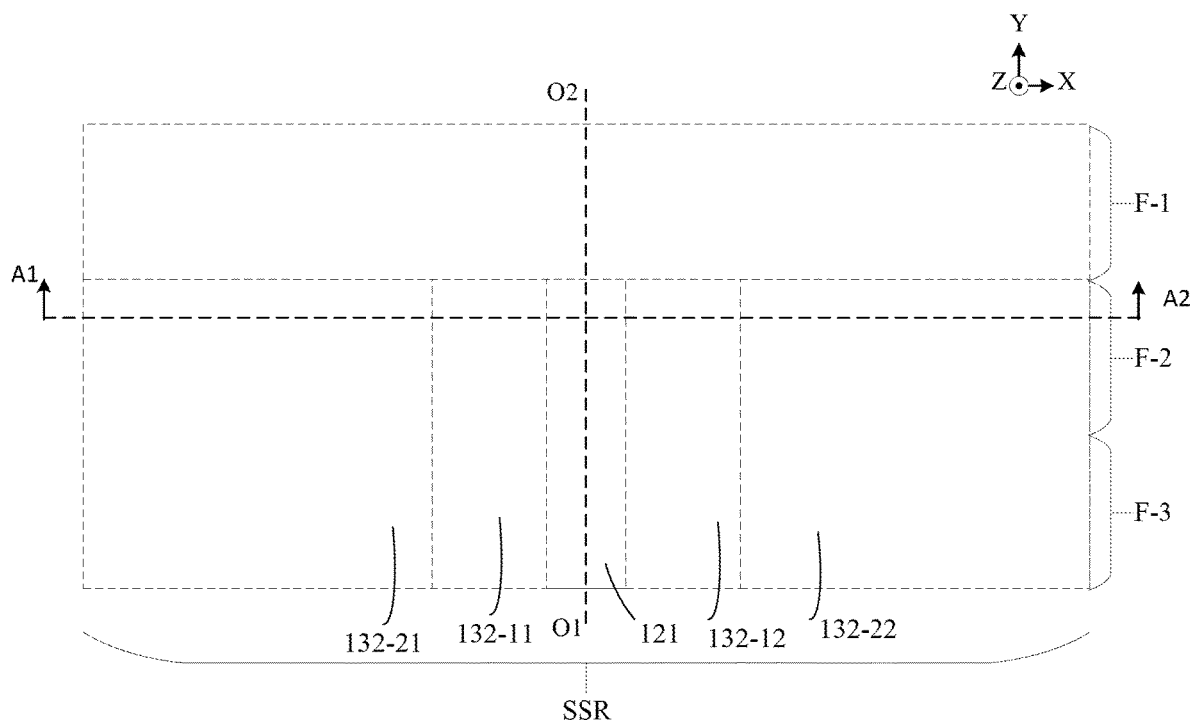
Figure 9:
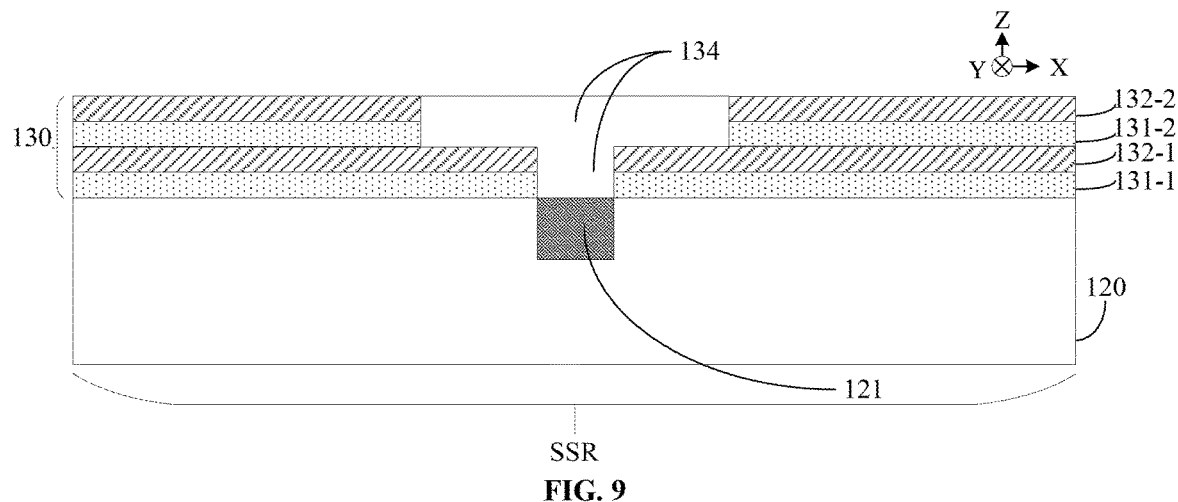

FIGS. 7 to 9 illustrate an exemplary BSG structure including exemplary BSG stairs on a substrate. FIG. 8 is a top view, and FIG. 7 is a cross-sectional view along direction A1-A1 in FIG. 8.

Referring to FIGS. 7 and 8, a BSG structure 130 may include, for example, a first BSG structure and a second BSG structure formed on the staircase-structure region (SSR) of the substrate 120 and on opposite sides of the doped well 121. In some embodiments, a top of the first BSG structure and a top of the second BSG structure may have a same height or different heights from the substrate 120.

Stairs are formed in the BSG structure 130. For example, the 131-1/132-1 pair forms a stair (or a stairstep); and the 131-2/132-2 pair forms another stair. The 131-1/132-1 stair and the 131-2/132-2 stair have different heights. A height of a stair may be a distance along Z direction from a reference plane to a surface of the stair. The surface of the stair may be, for example, a top surface of the stair or a top surface of a layer of the stair. The reference plane may be, for example, a surface plane of the substrate.

Stairs in the BSG structure may be formed on two sides of a central plane O1-O2 of the staircase-structure region (SSR). The central plane may be, for example, a plane parallel to the second direction and the third direction and at a central location of the staircase-structure region in the first direction. The 131-11/132-11 stair and the 131-21/132-21 stair may be on one side of the central plane O1-O2, and the 131-12/132-12 stair and the 131-22/132-22 stair may be on another side of the central plane O1-O2.

Step edges of the 131-11/132-11 stair and the 131-21/132-21 stair may be at different locations with respected to each other along X direction. The 131-11/132-11 stair extends into first sub-region R-11, and the 131-21/132-21 stair extends into second sub-region R-12. That is, the step edge of the 131-11/132-11 stair is in the first sub-region R-11, and the step edge of the 131-21/132-21 stair is in the second sub-region R-12.

In some embodiments, the BSG stairs may be formed by etching to remove portions of alternatingly arranged sacrificial layers and insulating layers, such as dry etch or wet etch.

Referring to FIG. 9, insulating layers 134 are formed in the BSG structure 130. The insulating layer may include, for example, oxide. The insulating layers 134 may be formed by depositing insulating materials in empty regions in the BSG structure, e.g., regions between the stairs of the BSG structure 130, via a deposition process, such as a chemical vapor deposition (CVD) process, a physical vapor deposition (PVD) process, and/or an atomic layer deposition (ALD) process; and removing excess insulating materials via a planarization process, such as a chemical-mechanical-planarization (CMP).

Referring to FIG. 4, cut slits, e.g., BSG cut slits, are formed in the BSG structure (S613). Correspondingly, FIG. 10 illustrates structures at certain stage(s) of the process of forming cut slits according to various embodiments of the present disclosure.

Figure 10:
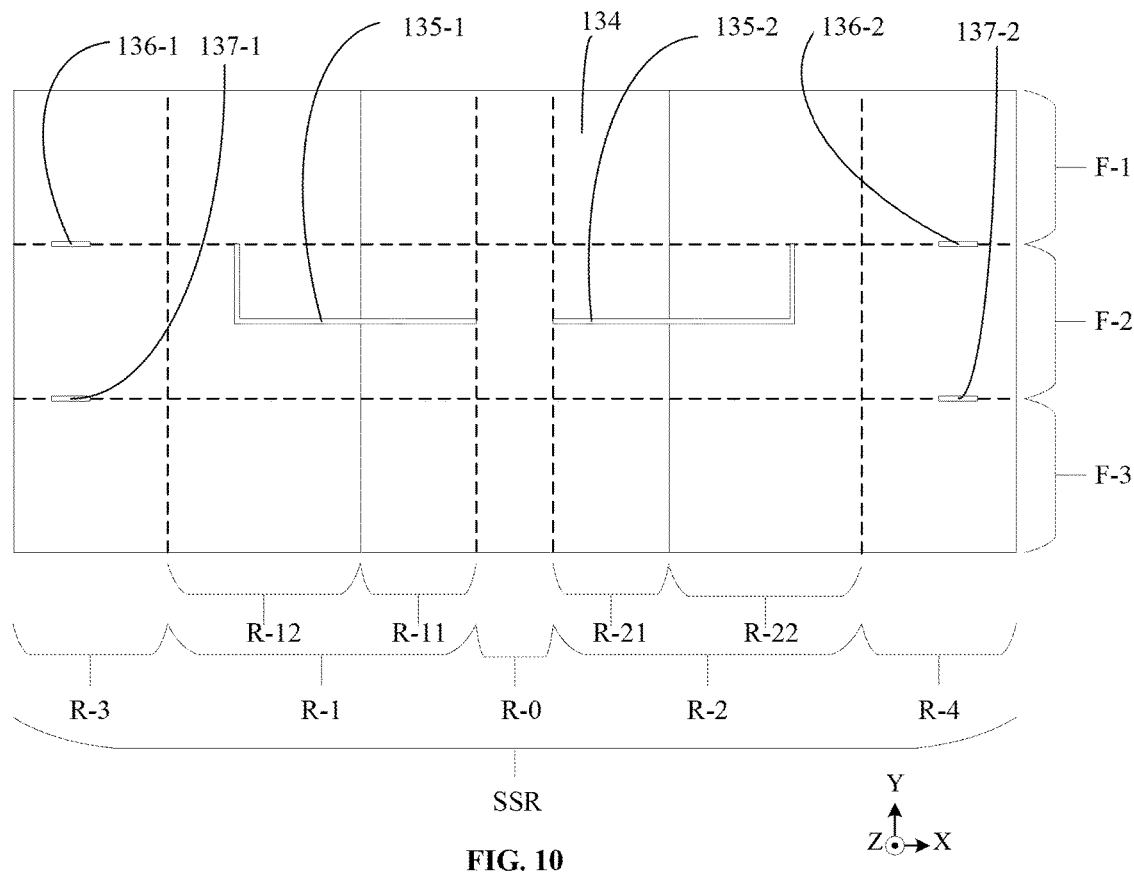
FIG. 10 illustrates structures at certain stage(s) during a process of forming cut slits according to various embodiments of the present disclosure.

Referring to FIG. 10, a plurality of cut slits are formed in the region SSR. Cut slit 135-1 may be formed, for example, in region (R-1, F-2) and may separate structures of the BSG structure 130 in region (R-1, F-2) into at least two portions. For example, stairs of the BSG structure 130 in region (R-1, F-2) may be divided into at least two portions by the cut slit 135-1.

In some embodiments, different stairs of the BSG structure 130 at different heights may extend into the first sub-region R-11 and the second sub-region R-12. For example, referring to FIGS. 7, 9 and 10, the 131-21/132-21 stair of extending into the region R-12 has a height different from a height of the 131-11/132-11 stair extending into the region R-11; and accordingly, in the region (R1, F-2), the cut slit 135-1 may separate the 131-21/132-21 stair into two portions, and separate the 131-11/132-11 stair into two portions.

Cut slit 135-2 is in region (R-2, F-2), i.e., a second BSG region R-2 of the second finger region F-2, and separate structure of the BSG structure 130 in region (R-2, F-2) into at least two portions. For example, stairs of the BSG structure 130 in region (R-2, F-2) may be divided into two portions.

In some embodiments, different stairs of the BSG structure 130 at different heights may extend into the first sub-region R-21 and the second sub-region R-22. For example, referring to FIGS. 7, 9, and 10, the 131-22/132-22 stair extending into the region R-22 has a height different from a height of the 131-12/132-12 stair extending into the region R-21. Accordingly, in the region (R2, F-2), the cut slit 135-2 may separate the 131-22/132-22 stair into two portions and separate the 131-12/132-12 stair into two portions.

Referring to FIG. 10, a cut slit 136-1 is at a boundary between regions F-1 and F-2 and in the region R-3; and a cut slit 136-2 is in at a boundary between regions F-1 and F-2 and in the region R-4. A cut slit 137-1 is at a boundary between regions F-2 and F-3 and in the region R-3; and a cut slit 137-2 is in at a boundary between regions F-2 and F-3 and in the region R-4.

In some embodiments, the cut slits of the BSG structure 130 may extend from a top of the BSG structure 130 to a portion of the substrate 120. In some embodiments, the cut slits of the BSG structure 130 may be formed by forming trenches in the BSG structure and the substrate and filling the trenches with an insulating material via a deposition process. The trenches may be formed, for example, by forming a mask layer over the BSG structure; patterning the mask layer by using photolithography to form openings corresponding to the trenches, and removing portions of the BSG structure and the substrate exposed by the openings until the trenches reach a preset depth in the substrate. The deposition process may include, for example, CVD, PVD, and/or ALD. The insulating material can include silicon oxide, silicon nitride, silicon oxynitride, and/or any other suitable insulating materials. In some embodiments, a chemical-mechanical planarization (CMP) may be used to remove excessive insulating material over after the deposition.

Returning to FIG. 4, a cell-layers structure including alternatingly arranged layers is formed on the BSG structure (S614). Correspondingly, FIGS. 11 to 16 illustrate structures at certain stages of the process of forming a cell-layers structure.

Figure 11:
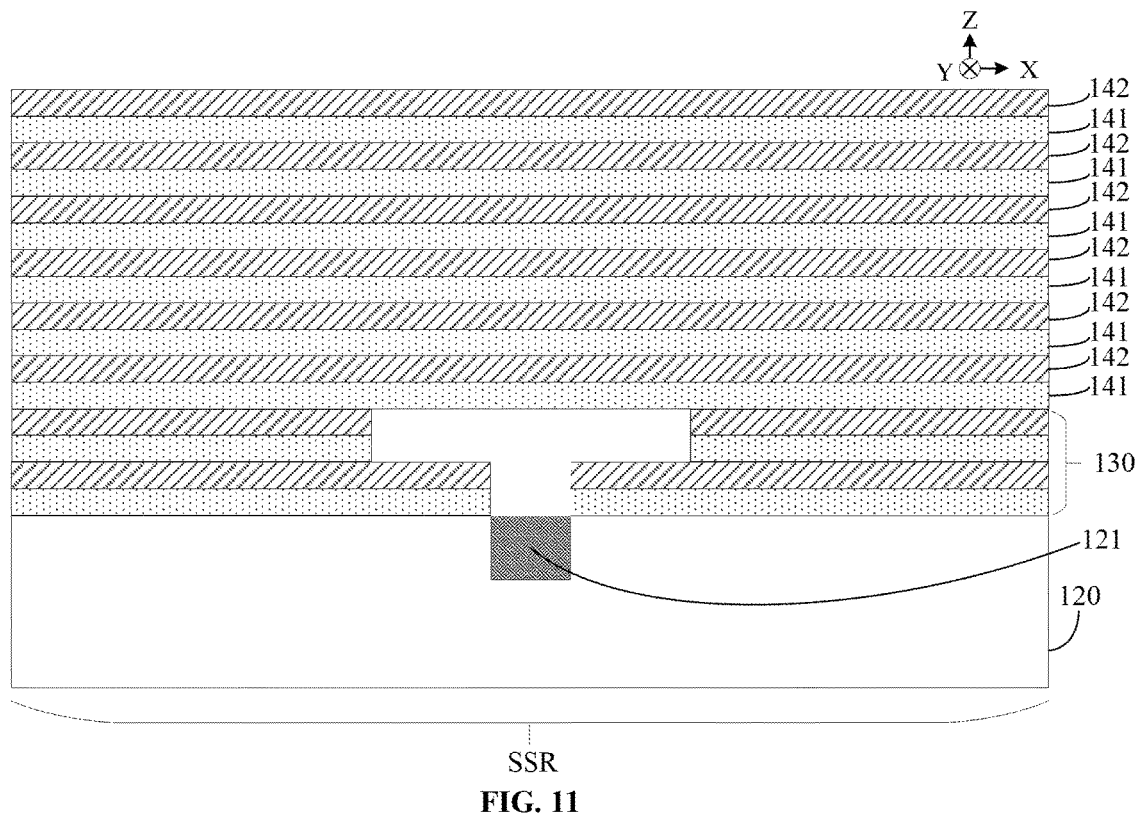
FIGS. 11 to 16 illustrate structures at certain stages during a process of forming a cell-layers structure according to various embodiments of the present disclosure.
Figure 12:
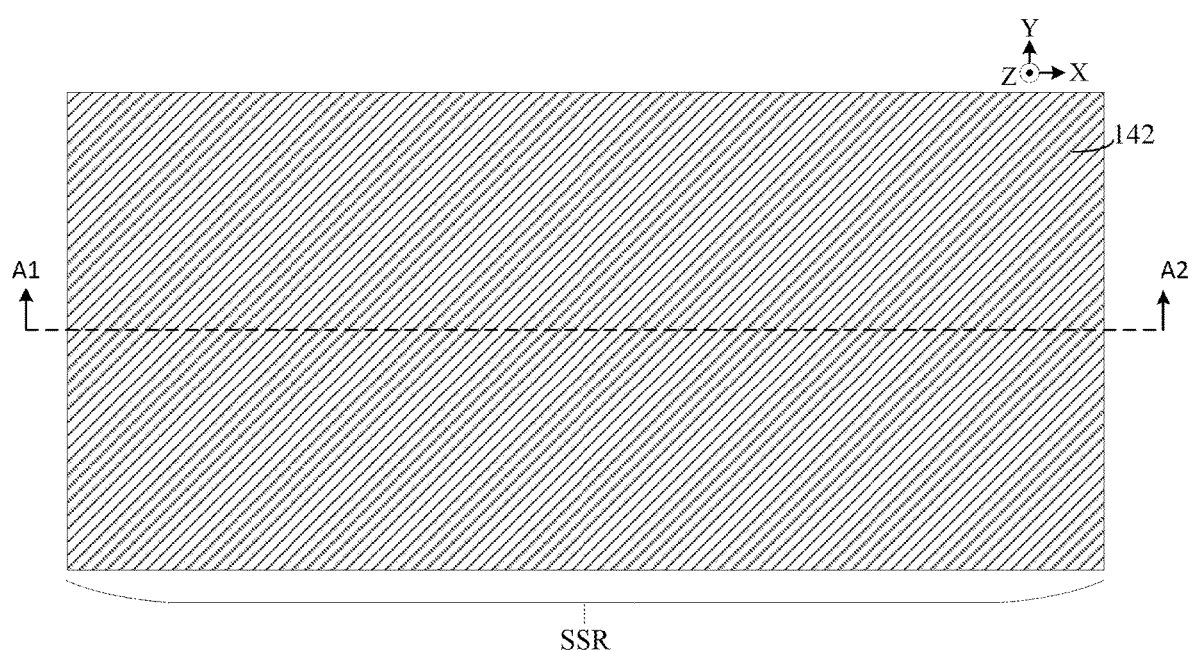

FIGS. 11 to 12 illustrate an exemplary stack structure including alternatingly arranged sacrificial layers and insulating layers for a cell-layers structure on a BSG structure and a substrate. FIG. 12 is a top view, and FIG. 11 is a cross-sectional view along direction A1-A2 in FIG. 12.

Referring to FIGS. 11 and 12, a stack structure including alternatingly arranged sacrificial layers 142 and insulating layers 141 for the cell-layers structure is deposited on the BSG structure 130. An insulating layer and an adjacent sacrificial layer may form a tier or a pair. In some embodiments, the sacrificial layer may include, for example, polysilicon, poly-germanium, and/or silicon nitride. In some embodiments, the insulating material may include, for example, an oxide material, such as silicon oxide.

The number of pairs may be chosen according to various application scenarios. The number of pairs may be, for example, a positive integer. The number of pairs may be, for example, 6, 16, 18, 32, 34, 64, 66, 132, 134 or any other suitable numbers, such as a suitable positive integer.

In some embodiments, the stack structure may include one or more sacrificial layer/insulating layer pairs, and further may include a bottom insulating layer and/or a top insulating layer. For example, the stack may include a bottom insulating layer and one or more sacrificial layer/insulating layer pairs, and the bottom insulating layer is in contact with a sacrificial layer of an adjacent pair. In some embodiments, in a sacrificial layer/insulating layer pair, the sacrificial layer may be above the insulating layer. In other embodiments, in a sacrificial layer/insulating layer pair, the insulating layer may be above the sacrificial layer.

In some embodiments, the cell-layers structure may be a structure that includes alternating sacrificial layer/insulating layer pairs that extend to memory cells of the three-dimensional memory device or alternating electrode/insulating layer pairs that extend to memory cells of the three-dimensional memory device, if sacrificial layers are replaced with electrodes. The electrode may be, for example, metal electrodes.

Figure 13:
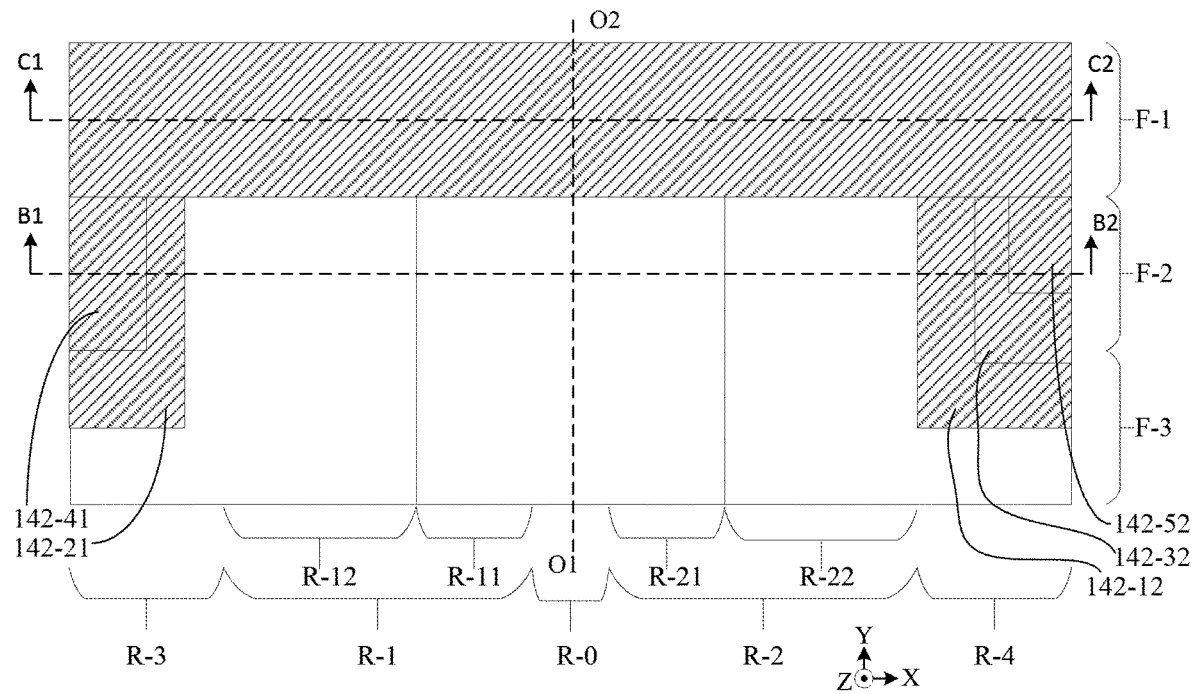
Figure 14:
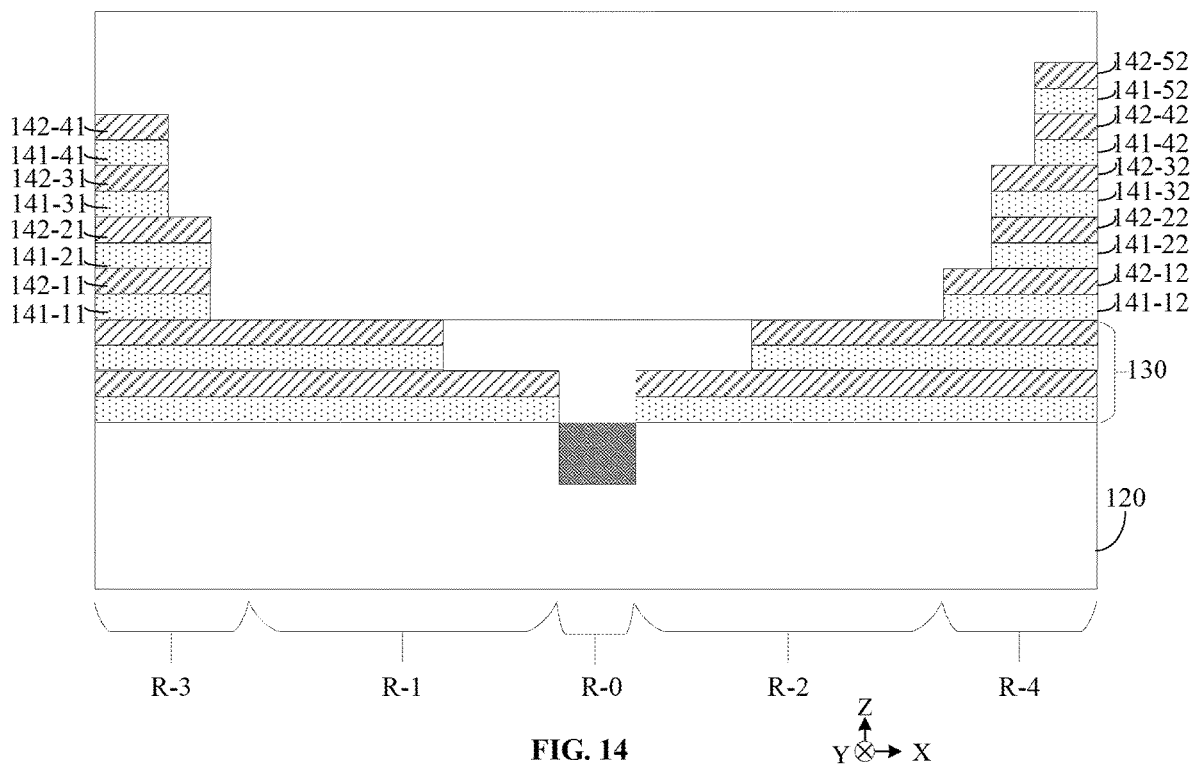
Figure 15:
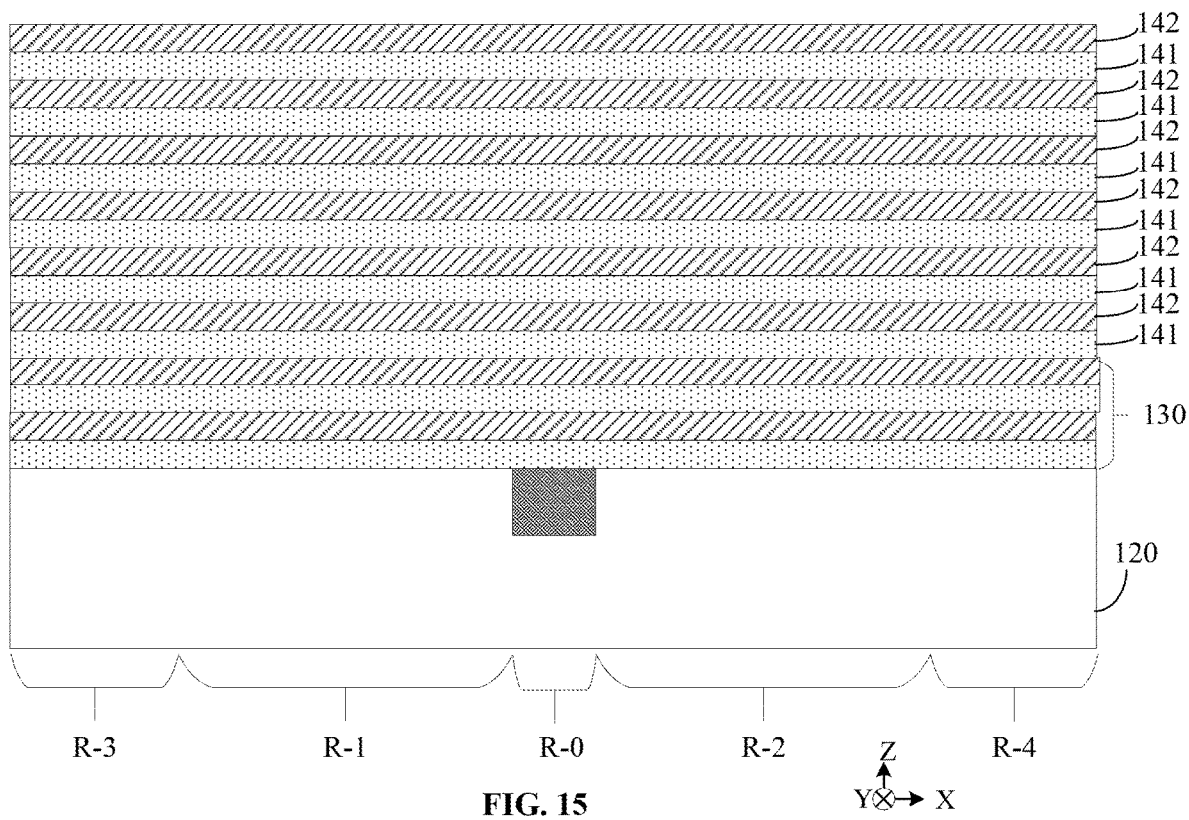
Figure 16:
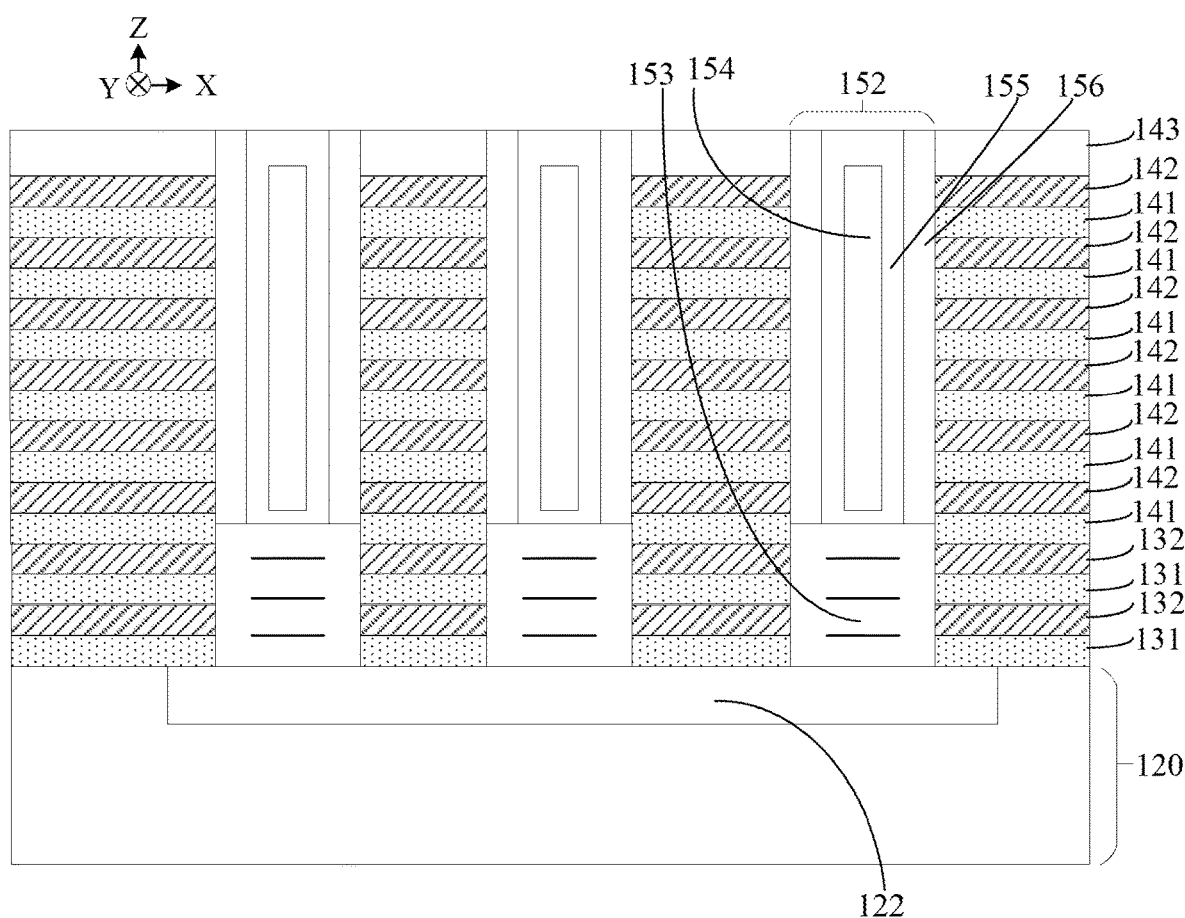

FIGS. 13 to 15 illustrate an exemplary cell-layers structure including stairs according to various embodiments of the present disclosure. FIG. 13 illustrates a top view of the exemplary cell-layers structure including stairs. FIG. 14 illustrates a cross-sectional view along direction B1-B2 in FIG. 13. FIG. 15 is a cross-sectional view along direction C1-C2 in FIG. 13. C1-C2 is in the wall region for forming a wall structure, i.e., region F-1, of the first semiconductor structure 110.

Referring to FIGS. 13, 14, and 15, portions of the sacrificial layer/insulating layer pairs of the cell-layers structure in regions F-2 and F-3 are removed to form layer pairs 141-12/142-12, 141-22/142-22, 141-32/142-32, 141-42/142-42, and 141-52/142-52 in regions (R-4, F-2) and (R-4, F-3), and layer pairs 141-11/142-11, 141-21/142-21, 141-31/142-31, and 141-41/142-41 in regions (R-3, F-2) and (R-3, F-3).

Referring to FIGS. 13 and 15, in region F-1, the sacrificial layer 142/insulating layer 141 pairs of the cell-layers structure in region (R-3, F-1) are connected to the sacrificial layer 142/insulating layer 141 pairs of the cell-layers structure in region (R-4, F-1). That is, in region F-1, the sacrificial layer/insulating layer pairs of the cell-layers structure in region (R-3, F-1) extend to the sacrificial layer/insulating layer pairs of the cell-layers structure in region (R-4, F-1). Accordingly, the sacrificial layer/insulating layer pairs of the cell-layers structure in the first array region, i.e., region AR-1, are connected with the sacrificial layer/insulating layer pairs of the cell-layers structure in the second array region, i.e., region AR-2 (not shown in FIG. 13). Region F-1 may be a wall region for forming a wall structure, in which layers of the cell-layers structure in region (R-3, F-1) may extend to the layers of the cell-layers structure in region (R-4, F-1).

In some embodiments, layer pairs 141-12/142-12, 141-32/142-32, and 141-52/142-52 may form stairs; and layer pairs 141-21/142-21 and 141-41/142-41 may form stairs. With the above-described connections in region F-1, region R-3 and region R-4 may share stairs. For example, layer pair 141-12/142-12 may serve as a stair for itself and for layer pair 141-11/142-11; layer pair 141-32/142-32 may serve as a stair for itself and for layer pair 141-31/142-31; layer pair 141-21/142-21 may serve as a stair for itself and for layer pair 141-22/142-22; and layer pair 141-41/142-41 may serve as a stair for itself and for layer pair 141-42/142-42. The sharing of the stairs may reduce the number of stairs and, thus, reduce lengths of the staircases.

In other embodiments, layer pairs on one side of central plane O1-O2 may each form a stair, and layer pairs on another side of central plane O1-O2 may each form a stair.

In some embodiments, the stairs in the cell-layers structure may include stairs for word lines. In some embodiments, the stairs in the cell-layers structure may include stairs for word lines and/or stairs for one or more top select gates. In some embodiments, the stairs in the cell-layers structure may include stairs for word lines, and stairs for one or more top select gates may be further formed over the stairs for word lines.

Forming the cell-layers structure (S614) may further include forming one or more insulating layers. The insulating layers may be formed over the alternatingly arranged sacrificial layers and insulating layers of the cell-layers structure; and space between the stairs of the cell-layers structure. The insulating layer may include, for example, oxide. The insulating layers may be formed by depositing insulating materials via a deposition process, such as a chemical vapor deposition (CVD) process, a physical vapor deposition (PVD) process, and/or an atomic layer deposition (ALD) process; and removing excess insulating materials via a planarization process, such as a chemical-mechanical-planarization (CMP).

The cell-layers structure may further include NAND strings in the first and second array regions. A NAND string may be, for example, a memory string including NAND memory cells. FIG. 16 illustrates a schematic view of structures in an exemplary array region. The array region of the cell-layers structure includes a plurality of NAND strings 152. The array region may be, for example, the first array region or the second array region.

The plurality of NAND strings 152 may be formed on a doped region 122 of the substrate 120 and may extend vertically through alternatingly arranged sacrificial layers 142 and insulating layers 141 and an insulating layer 143. The NAND string 152 may include an epitaxial layer 153, a semiconductor channel 155, and a dielectric layer 156, and an insulating layer 154. The epitaxial layer 153 may be at the lower end of the NAND string 152 and may contact both the semiconductor channel 155 and a doped region 122 of substrate 120. The epitaxial layer 153 may serve as a channel controlled by a select gate at the lower end of the NAND string, such as a bottom select gate. In some embodiments, the semiconductor channel 155 may include silicon, such as amorphous silicon, polysilicon, and/or single crystalline silicon. In some embodiments, the dielectric layer 156 may include a tunneling layer, a storage layer, and a blocking layer. The NAND string 152 may have, for example, a cylinder shape. In some embodiments, the tunneling layer, the storage layer, and the blocking layer may be arranged in such order from a center toward the outer surface of the cylinder. For example, the tunneling layer may be close to the semiconductor channel 155; the storage layer is farther from the semiconductor channel 155 than the tunneling layer is; and the blocking layer is farther from the semiconductor channel 155 than the storage layer. The NAND string 152 may be in contact with the alternatingly arranged sacrificial layers 142 and insulating layers 141, and alternatingly arranged sacrificial layers 132 and insulating layers 131.

Figure 17:
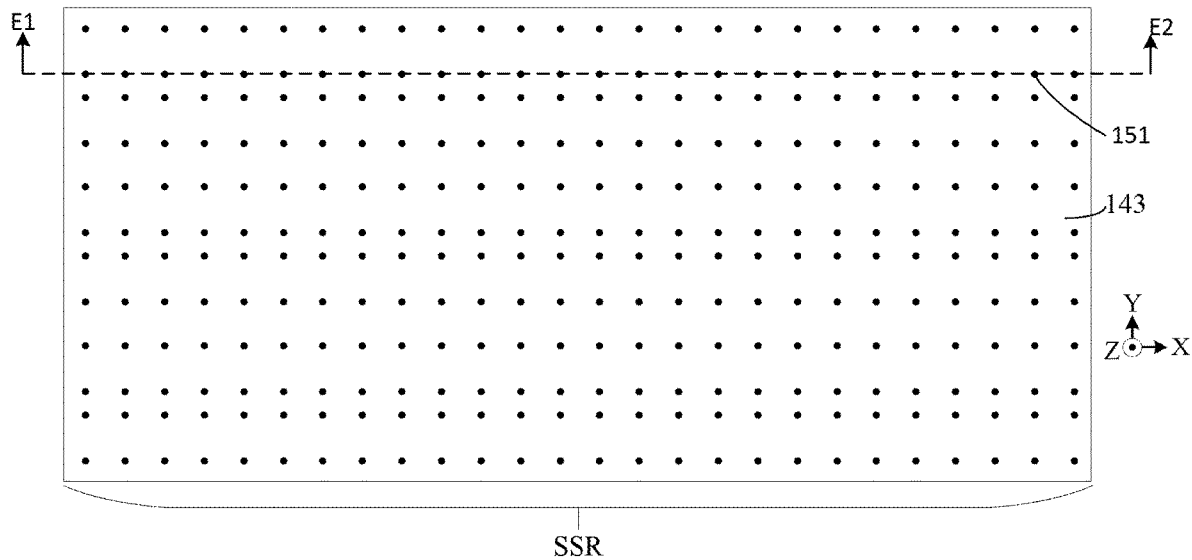
FIGS. 17 to 18 illustrate structures at certain stages during a process of forming channels according to various embodiments of the present disclosure.
Figure 18:
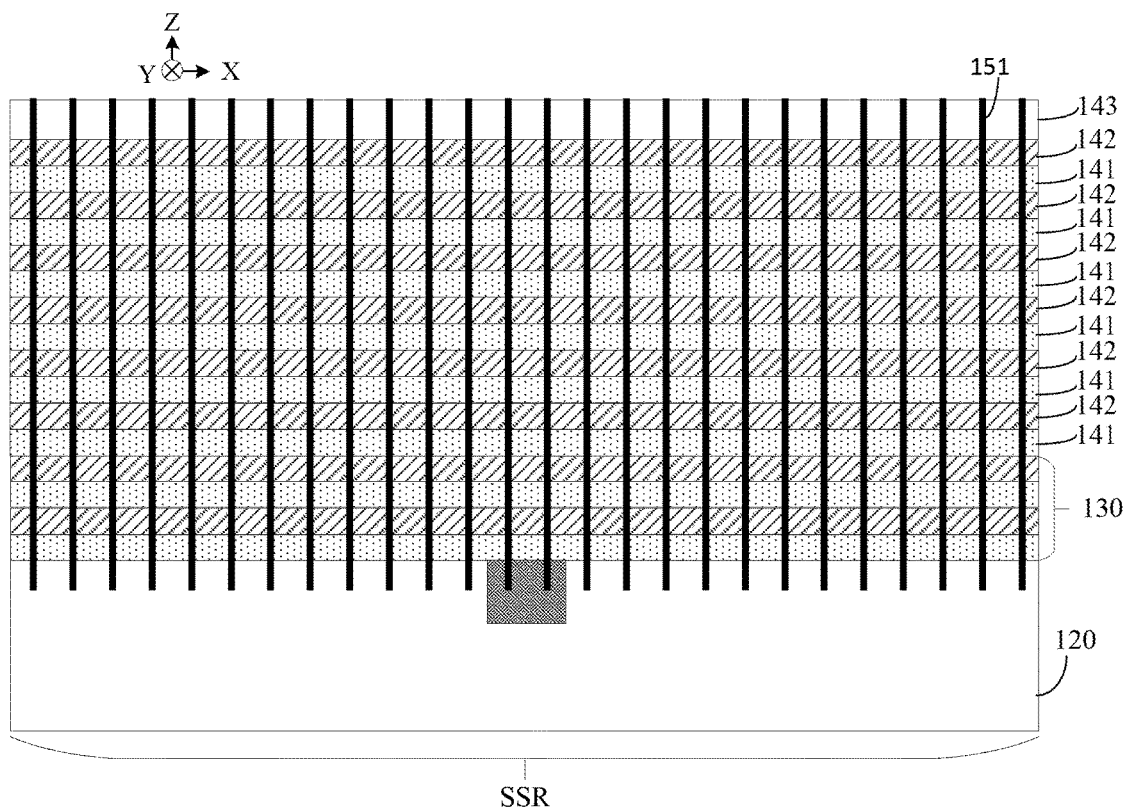

Returning to FIG. 4, channels extending through the BSG structure and the cell-layers structure are formed (S615). Correspondingly, FIGS. 17 to 18 show structures at certain stages of the process of forming channels. FIG. 17 illustrates a top view. FIG. 18 is a cross-sectional view along direction E1-E2 in FIG. 16.

Referring to FIGS. 17 and 18, a plurality of channels 151 are formed. Referring to FIG. 18, the plurality of channels 151 may extend through the BSG structure and the cell-layers structure from a top portion of the cell-layers structure 130 to a portion of the substrate 120. For example, the plurality of channels 151 may extend from an insulating layer 143 at a top portion of the cell-layers structure 130 to a portion of the substrate 120. In some embodiments, the plurality of channels may include dummy channels, such as dummy channels in the region SSR. The dummy channels may support one or more stacks and layers during removal of sacrificial layers.

In some embodiments, an insulating layer may be further formed on the cell-layers structure. For details about forming insulating layer, references can be made to the above descriptions.

Figure 19:
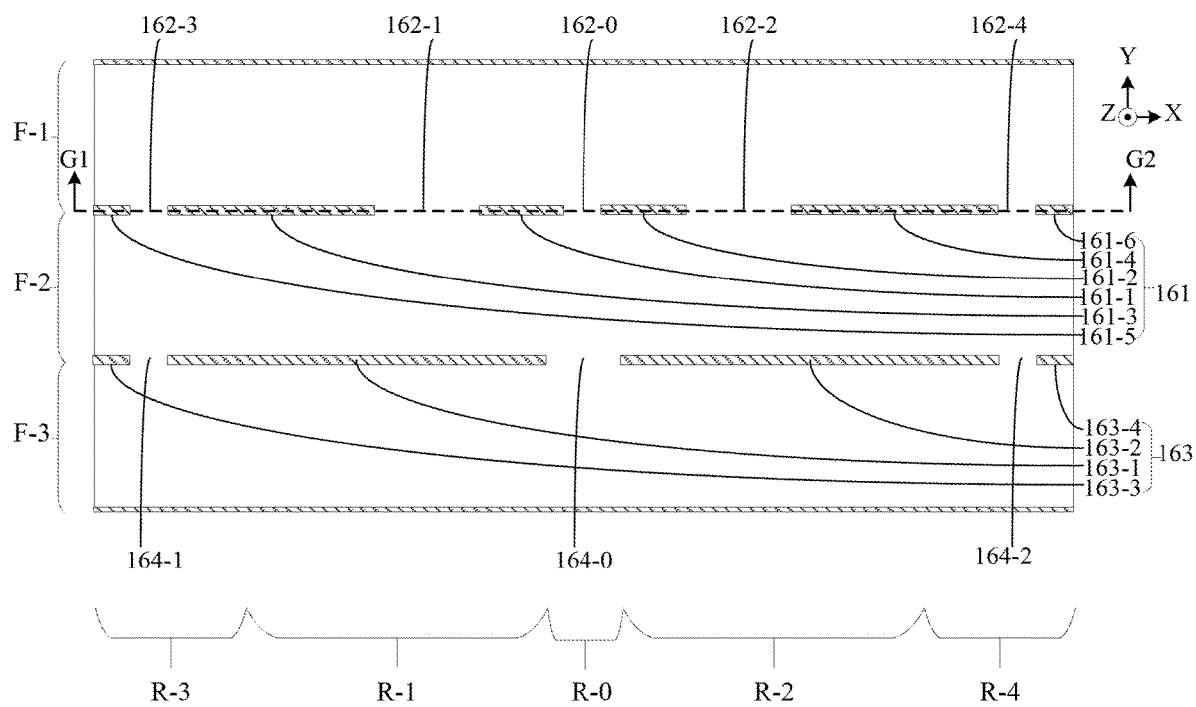
FIGS. 19 to 20 illustrate structures at certain stages during a process of forming one or more gate-line slits according to various embodiments of the present disclosure.
Figure 20:
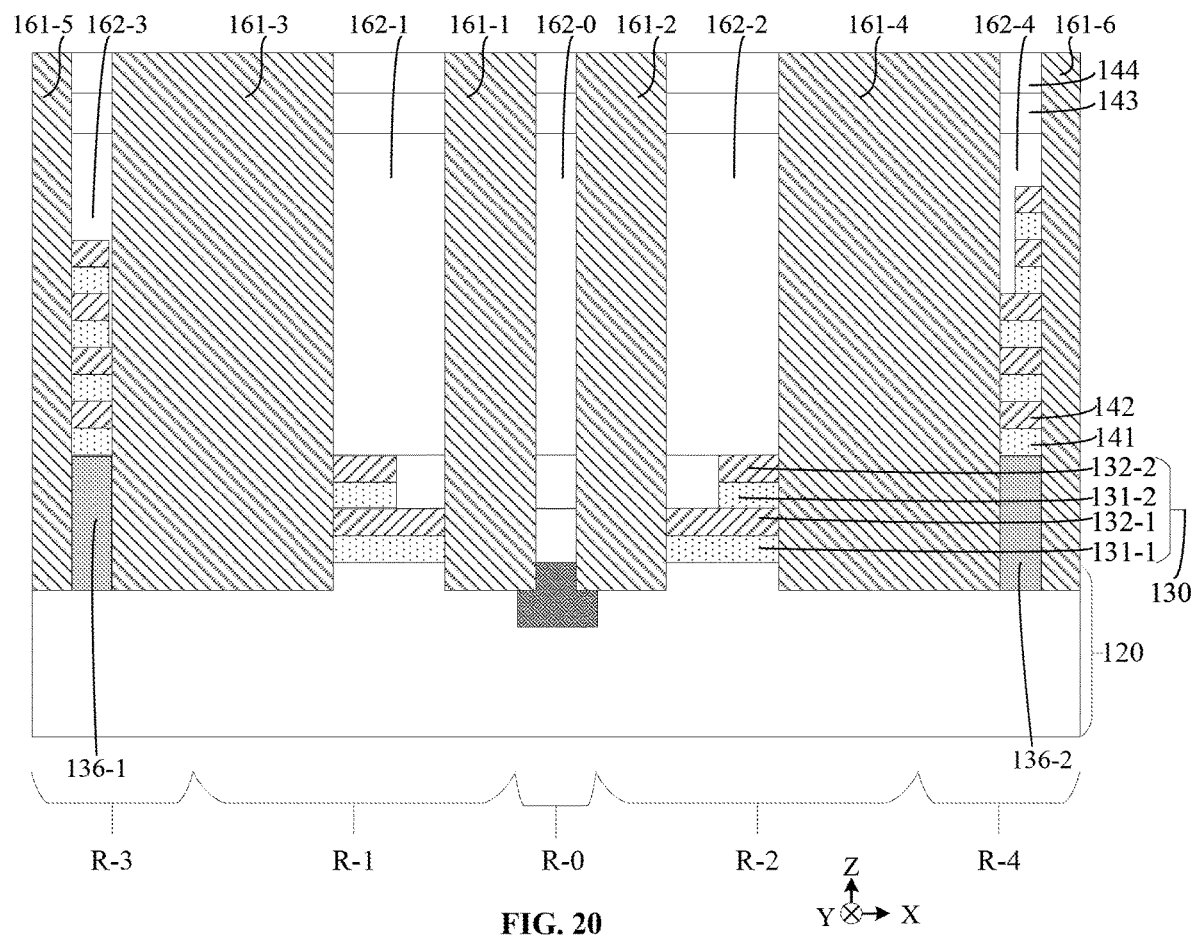

Returning to FIG. 4, one or more gate-line slits are formed between a plurality of finger regions of the three-dimensional memory device (S616). FIGS. 19 to 20 show structures at certain stages of the process of forming one or more gate-line slits. FIG. 19 is a top view and FIG. 20 is a cross-sectional view along direction G1-G2 in FIG. 19.

Referring to FIGS. 19 and 20, a gate-line slit 161 is formed between regions F-1 and F-2, so as to distinguish the two finger regions. The gate-line slit 161 includes a plurality of gate-line sub-slits 161-1, 161-2, 161-3, 161-4, 161-5 and 161-6, each extending vertically through BSG structure and the cell-layers structure and extending into a portion of the substrate 120. For example, the plurality of gate-line sub-slits 161-1, 161-2, 161-3, 161-4, 161-5 and 161-6 may extend along Z direction or −Z direction from an insulating layer 144 into the substrate 120. Between the plurality of gate-line sub-slits 161-1, 161-2, 161-3, 161-4, 161-5 and 161-6, there are a plurality of inter portions or inter-sub-slit portions 162-0, 162-1, 162-2, 162-3, 162-4, and 162-5. If alternatingly arranged sacrificial layers and insulating layers of the cell-layers structure exist on both the first finger region and the second finger region and adjacent to an inter-sub-slit portion, the alternatingly arranged sacrificial layers and insulating layers of the cell-layers structure in the first finger region may be connected to the alternatingly arranged sacrificial layers and insulating layers of the cell-layers structure in the second finger region via the inter-sub-slit portion. For example, insulating layer 141/sacrificial layer 142 pairs in the first finger region may be connected to insulating layer 141/sacrificial layer 142 pairs in the second finger region via the inter-sub-slit portion 162-4. Similarly, insulating layer 141/sacrificial layer 142 pairs in the first finger region may be connected to insulating layer 141/sacrificial layer 142 pairs in the second finger region via the inter-sub-slit portion 162-3. Adjacent to inter-sub-slit portion 162-0, 162-1, and 162-2, insulating layer 141/sacrificial layer 142 pairs may exist in the first finger region, and insulating layer 141/sacrificial layer 142 pairs may be removed in the second finger region.

In some embodiments, the cut slit 136-1 may be between one or more insulating layer/sacrificial layer pairs of the BSG structure in region (R3, F-1) and one or more insulating layer/sacrificial layer pairs of the BSG structure in region (R3, F-2). Accordingly, at the cut slit 136-1, one or more insulating layer/sacrificial layer pairs of the BSG structure in region (R3, F-1) may be separated from one or more insulating layer/sacrificial layer pairs of the BSG structure in region (R3, F-2) by the cut slit 136-1.

In some embodiments, the cut slit 136-2 may be between one or more insulating layer/sacrificial layer pairs of the BSG structure in region (R4, F-1) and one or more insulating layer/sacrificial layer pairs of the BSG structure in region (R4, F-2). Accordingly, at the cut slit 136-2, the one or more insulating layer/sacrificial layer pairs of the BSG structure in region (R4, F-1) may be separated from the one or more insulating layer/sacrificial layer pairs of the BSG structure in region (R4, F-2) by the cut slit 136-2.

Figure 21:
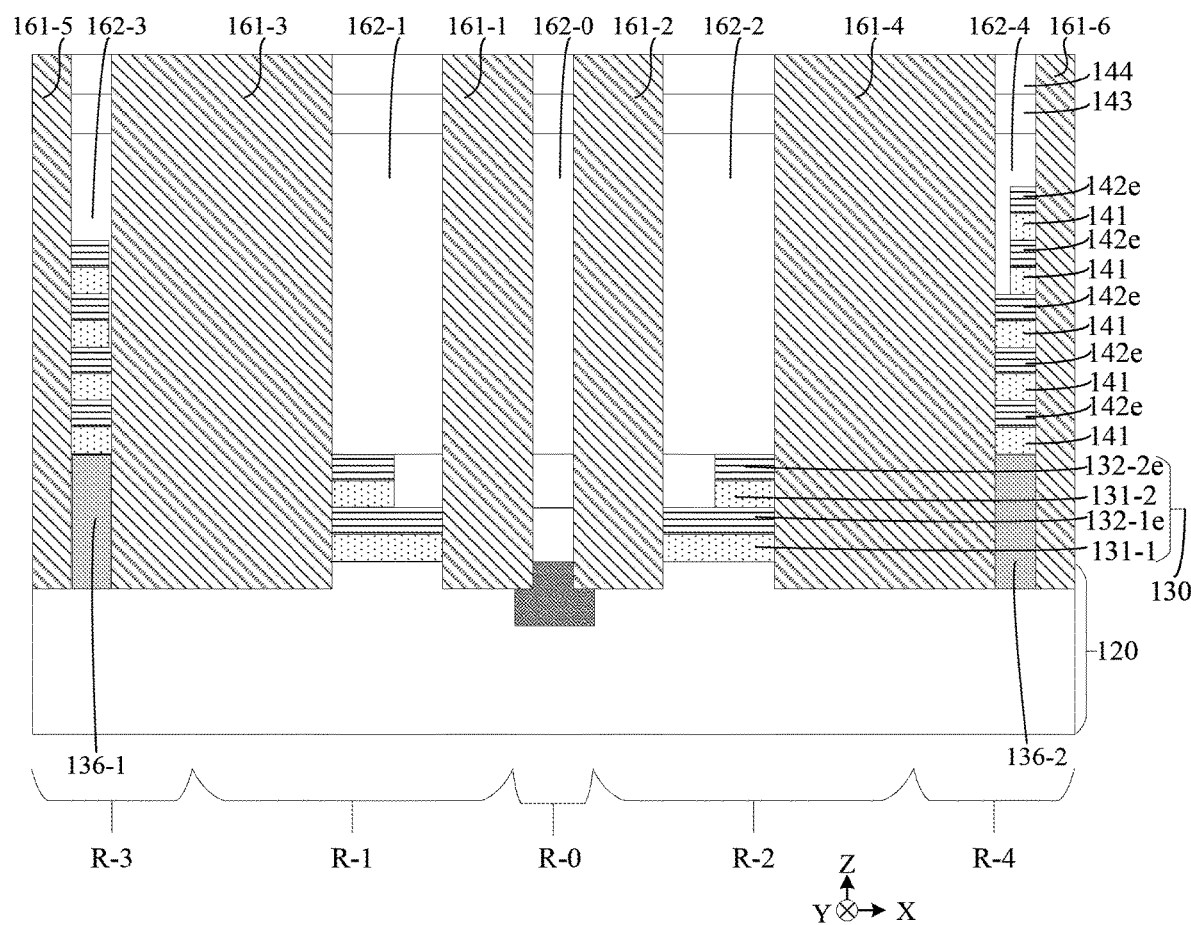
FIG. 21 illustrates a cross-sectional view along direction C1-C2 in FIG. 19 after sacrificial layers in a 3D memory device are removed and a plurality of electrodes are formed according to various embodiments of the present disclosure.

In some embodiments, sacrificial layers in the BSG structure and sacrificial layers in the cell-layers structure may be removed to form horizontal trenches between insulating layers in the BSG structure and horizontal trenches between insulating layers in the cell-layers structure. Further, a plurality of electrodes may be formed in horizontal trenches. The plurality of electrodes may include a plurality of word lines, and one or more bottom select gates. In some embodiments, the plurality of electrodes may further include, for example, one or more top select gates. FIG. 21 illustrates a cross-sectional view along direction G1-G2 in FIG. 19 after sacrificial layers in a 3D memory device are removed and a plurality of electrodes are formed.

Referring to FIGS. 19 and 21, the gate-line slit 161 is between regions F-1 and F-2, so as to distinguish regions F-1 and F-2.

For electrodes 142e and insulating layers 141 of the cell-layers structure existing in both region F-1 and the region F-2, adjacent to an inter-sub-slit portion, and at same heights with respect to a substrate surface, the electrodes and insulating layers of the cell-layers structure in the first finger region may be connected to the electrodes and insulating layers of the cell-layers structure in the second finger region at the inter-sub-slit portion.

In some embodiments, the electrodes 142e of the cell-layers structure may include, for example, one or more word lines. In some embodiments, the electrodes 142e of the cell-layers structure may include, for example, one or more word lines and/or one or more top select gates.

In some embodiments, electrode 142e/insulating layer 141 pairs in the first finger region may be connected to electrode 142e/insulating layer 141 pairs in the second finger region at the inter-sub-slit portion 162-4. Accordingly, word lines in the first finger region may be connected to, e.g., electrically connected to, word lines in the second finger region at the inter-sub-slit portion 162-4.

In some embodiments, electrode 142e/insulating layer 141 pairs in the first finger region may be connected to electrode 142e/insulating layer 141 pairs in the second finger region at the inter-sub-slit portion 162-3. Accordingly, word lines in the region first finger region may be connected to, e.g., electrically connected to, word lines in the second finger region at the inter-sub-slit portion 162-3.

One or more electrode/insulating layer pairs in the BSG structure 130 may include, for example, an electrode 132-1e/insulating layer 131-1 pair and/or an electrode 132-2e/insulating layer 131-2 pair. The electrode 132-e and the electrode 132-2e may be bottom select gates.

In some embodiments, a cut slit may be between one or more electrode/insulating layer pairs in the BSG structure in the region F-1 and one or more electrode/insulating layer pairs in the BSG structure in the region F-2; and at the cut slit, the cut slit may separate the one or more electrode/insulating layer pairs in the BSG structure in region F-1 from the one or more electrode/insulating layer pairs in the BSG structure in region F-2, and accordingly separate bottom select gates in the BSG structure in region F-1 from bottom select gates in the BSG structure in region F-2.

In some embodiments, a cut slit may be between one or more electrode/insulating layer pairs in the BSG structure in the region F-2 and one or more electrode/insulating layer pairs in the BSG structure in the region F-3; and at the cut slit, the cut slit may separate the one or more electrode/insulating layer pairs in the BSG structure in region F-2 from the one or more electrode/insulating layer pairs in the BSG structure in region F-3, and accordingly separate bottom select gates in the BSG structure in region F-2 from bottom select gates in the BSG structure in region F-3.

For example, referring to FIG. 20, the cut slit 136-1 may be between one or more electrode/insulating layer pairs in the BSG structure in region (R3, F-1) and one or more electrode/insulating layer pairs in the BSG structure in region (R3, F-2). Accordingly, at the cut slit 136-1, the one or more electrode/insulating layer pairs of the BSG structure in region (R3, F-1) may be separated from the one or more electrode/insulating layer pairs of the BSG structure in region (R3, F-2) by the cut slit 136-1; and at the cut slit 136-1, bottom select gates in region (R3, F-1) may be separated from bottom select gates in region (R3, F-2) by the cut slit 136-1.

As another example, the cut slit 136-2 may be between one or more electrode/insulating layer pairs in the BSG structure in region (R4, F-1) and one or more electrode/insulating layer pairs in the BSG structure in region (R4, F-2). Accordingly, at the cut slit 136-2, the one or more electrode/insulating layer pairs of the BSG structure in region (R4, F-1) may be separated from the one or more electrode/insulating layer pairs of the BSG structure in region (R4, F-2) by the cut slit 136-2; and at the cut slit 136-2, bottom select gates in region (R4, F-1) may be separated from bottom select gates in region (R4, F-2) by the cut slit 136-2.

Figure 22:
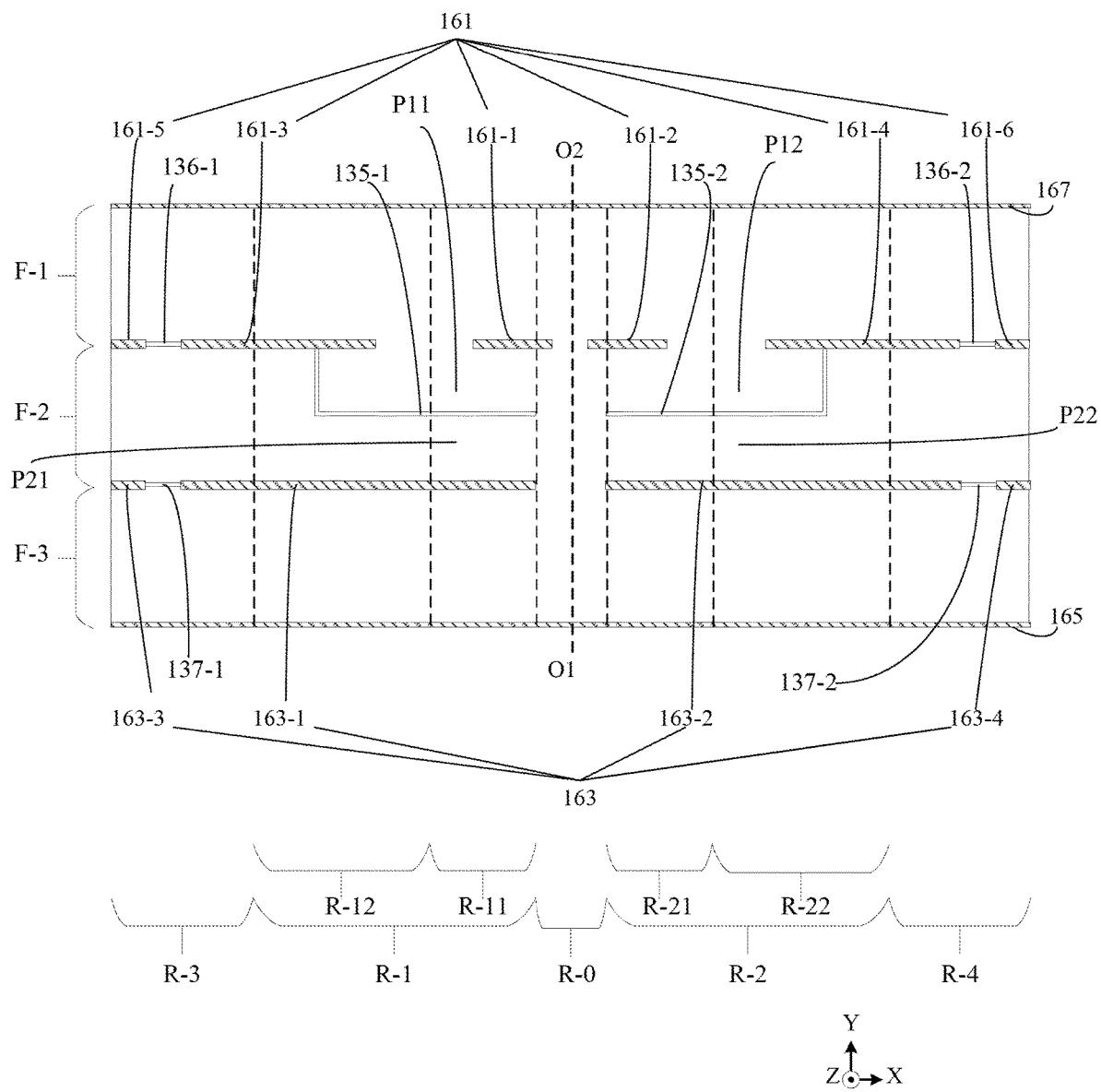
FIG. 22 illustrates a schematic view of orthogonal projections of exemplary gate-line slits and cut slits on the substrate according to various embodiments of the present disclosure.

FIG. 22 illustrates a schematic view of orthogonal projections of exemplary gate-line slits and cut slits on the substrate according to various embodiments of the present disclosure. The cut slits, such as cut-slits 135-1, 135-2, 136-1, 136-1, 137-1, and 137-2, may extend vertically through the BSG structure, e.g., extend vertically from a top of the BSG structure to a portion of the substrate. Accordingly, a cut slit may separate layers, stairs, and/or electrodes in the BSG structure on two sides of the cut slit. That is, layers, stairs, and/or electrodes in the BSG structure on one side of the cut slit are separated from layers, stairs, and/or electrodes in the BSG structure on another side of the cut slit. A plurality of gate-line slits, such as gate-line slits 161, 163, 165, and 167 may extend vertically through the cell-layers structure and the BSG, and may extend vertically into a portion of the substrate. The gate-line slit 161 may include a plurality of gate line sub-slits 161-1, 161-2, 161-3, 161-4, 161-5, and 161-6; and the gate-line slit 163 may include gate line sub-slits 163-1, 163-2, 163-3, and 163-4.

In some embodiments, one or more gate-line slits may extend vertically through the BSG structure and the cell-layers structure, and extend vertically into a portion of the substrate, to distinguish a plurality of finger regions of the three-dimensional memory device.

In some embodiments, referring to FIG. 22, at an inter-sub-slit portion between gate line sub-slits 161-1 and 161-3, one or more bottom select gates of the first finger region in regions R-1 may be connected to one or more bottom select gates in a first portion P11 of the second finger region. Accordingly, the one or more bottom select gates in the first finger region and the one or more bottom select gates in the first portion P11 of the second finger region may be connected to NAND strings of the first array region (region AR-1) in the first finger region, and server as bottom select gates for the NAND strings of the first array region (region AR-1) and in the first finger region.

The one or more bottom select gates in the first portion P11 of the second finger region include BSG stairs suitable for forming contacts thereon, and contacts may be formed on the one or more bottom select gates in the first portion P11 of the second finger region and for the NAND strings of the first array region in the first finger region. That is, contacts may be formed on stairs of the one or more bottom select gates in the first portion P11 of the second finger region; the stairs of the one or more bottom select gates in the first portion P11 of the second finger region may correspond to the NAND strings of the first array region in the first finger region; and the contacts may be for the NAND strings of the first array region in the first finger region.

In some embodiments, the first portion of the second finger region may be in region R-1. In other embodiments, the first portion of the second finger region may be in regions R-1 and R-3.

The one or more bottom select gates in the first portion P11 of the second finger region may be separated from one or more bottom select gates in the second portion P21 of the second finger region by cut slits 135-1 and 136-1 and gate-line sub-slits 161-3, and 161-5.

The one or more bottom select gates in the second portion P21 of the second finger region may be connected to NAND strings of the region AR-1 in the second finger region, and server as bottom select gates for the NAND strings of the region AR-1 and in the second finger region.

Contacts may be formed on the one or more bottom select gates in the second portion P21 of the second finger region, for the NAND strings of the region AR-1 in the second finger region. That is, contacts may be formed on stairs of the one or more bottom select gates in the second portion P21 of the second finger region, for the NAND strings of the region AR-1 in the second finger region; the stairs of the one or more bottom select gates in the second portion P21 of the second finger region may correspond to the NAND strings of the region AR-1 in the second finger region; and the contacts may be for the NAND strings of the region AR-1 in the second finger region.

At an inter-sub-slit portion between gate line sub-slits 161-3 and 161-5, a plurality of word lines in the first finger region may be connected to, e.g., electrically connected to, a plurality of word lines in the second finger region.

One or more bottom select gates in the second portion P21 of the second finger region may be separated from one or more bottom select gates of the third finger region in regions R-1 and R-3 by cut slit 137-1 and gate-line sub-slits 163-1 and 161-3.

The one or more bottom select gates of the third finger region in regions R-1 and R-3 may be connected to NAND strings of the region AR-1 in the third finger region, and server as bottom select gates for the NAND strings of the region AR-1 in the third finger region.

The one or more bottom select gates in region R-1 may include, for example, a first bottom select gate extending into region R-11, and a second bottom select gate extending into region R-12. A stair of the first bottom select gate may extend into region R-11, and a stair of the second bottom select gate may extend into region R-12.

At an inter-sub-slit portion between gate line sub-slits 163-1 and 163-3, a plurality of word lines in the second finger region may be connected to, e.g., electrically connected to, a plurality of word lines in the third finger region in regions R-1 and R-3.

In some embodiments, referring to FIG. 22, at an inter-sub-slit portion between gate line sub-slits 161-2 and 161-4, one or more bottom select gates of the first finger region in regions R-2 and R-4 may be connected to one or more bottom select gates in a first portion P12 of the second finger region. Accordingly, the one or more bottom select gates in the first finger region and the one or more bottom select gates in the first portion P12 of the second finger region may be connected to NAND strings of the region AR-2 in the first finger region, and server as bottom select gates for the NAND strings of the region AR-2 in the first finger region.

The one or more bottom select gates in the first portion P12 of the second finger region may include BSG stairs suitable for forming contacts thereon, and contacts may be formed on the one or more bottom select gates in the first portion P12 of the second finger region and for the NAND strings of the region AR-2 in the first finger region. That is, contacts may be formed on stairs of the one or more bottom select gates in the first portion P12 of the second finger region; the stairs of the one or more bottom select gates in the first portion P12 of the second finger region may correspond to the NAND strings of the region AR-2 in the first finger region; and the contacts may be for the NAND strings of the region AR-2 in the first finger region.

In some embodiments, the first portion, such as P12, of the second finger region may be in region R-2. In other embodiments, the first portion of the second finger region may be in regions R-2 and R-4.

The one or more bottom select gates in the first portion P12 of the second finger region may be separated from one or more bottom select gates in the second portion P22 of the second finger region by cut slits 135-2 and 136-2 and gate-line sub-slits 161-4 and 161-6.

The one or more bottom select gates in the second portion P22 of the second finger region may be connected to NAND strings of the region AR-2 in the second finger region, and server as bottom select gates for the NAND strings of the region AR-2 in the second finger region.

Contacts may be formed on the one or more bottom select gates in the second portion P22 of the second finger region, for the NAND strings of the region AR-2 in the second finger region. That is, contacts may be formed on stairs of the one or more bottom select gates in the second portion P22 of the second finger region, for the NAND strings of the region AR-2 in the second finger region; the stairs of the one or more bottom select gates in the second portion P22 of the second finger region may correspond to the NAND strings of the region AR-2 in the second finger region; and the contacts may be for the NAND strings of the region AR-2 in the second finger region.

At an inter-sub-slit portion between gate line sub-slits 161-4 and 161-6, a plurality of word lines in the first finger region may be connected to, e.g., electrically connected to, a plurality of word lines in the second finger region.

One or more bottom select gates in the second portion P22 of the second finger region may be separated from one or more bottom select gates in the third finger region in regions R-2 and R-4 by cut slit 137-2 and gate-line sub-slits 163-2 and 163-4.

The one or more bottom select gates in the third finger region and in regions R-2 and R-4 may be connected to NAND strings of the region AR-2 in the third finger region, and server as bottom select gates for the NAND strings of the region AR-2 in the third finger region.

The one or more bottom select gates in region R-2 may include, for example, a first bottom select gate extending into region R-21, and a second bottom select gate extending into region R-22. That is, a stair of the first bottom select gate may extend into region R-21, and a stair of the second bottom select gate may extend into region R-22.

At an inter-sub-slit portion between gate line sub-slits 163-2 and 163-4, a plurality of word lines in the second finger region may be connected to, e.g., electrically connected to, a plurality of word lines in the third finger region in regions R-2 and R-4.

In some embodiments, gate-line slits or gate-line sub-slits may be symmetric with respect to the central plane O1-O2 of the staircase-structure region. For example, referring to FIG. 22, gate-line sub-slits 161-1 and 161-2 are symmetric with respect to the central plane O1-O2 of the staircase-structure region; gate-line sub-slits 161-3 and 161-4 are symmetric with respect to the central plane O1-O2; gate-line sub-slits 161-5 and 161-6 are symmetric with respect to the central plane O1-O2; gate-line sub-slits 163-1 and 163-2 are symmetric with respect to the central plane O1-O2; and gate-line sub-slits 163-3 and 163-4 are symmetric with respect to the central plane O1-O2.

In some embodiments, cut slits may be symmetric with respect to the central plane O1-O2. For example, referring to FIG. 22, cut slits 135-1 and 135-2 are symmetric with respect to the central plane O1-O2; cut slits 136-1 and 136-2 are symmetric with respect to the central plane O1-O2; and cut slits 137-1 and 137-2 are symmetric with respect to the central plane O1-O2.

In some embodiments, an orthogonal projection of a cut slit on the substrate may include one or more straight-line segments. For example, the orthogonal projection of cut slit 136-1 is a straight-line segment. In some embodiments, the orthogonal projection of a cut slit, such as cut slit 135-1 or 135-2, may include two straight line segments, and an angle between the two straight line segments may be approximately 90 degrees. In other embodiments, two straight line segments of an orthogonal projection of a cut slit may be approximately 70 degrees, 75 degrees, 80 degrees, 85 degrees, 90 degrees, 95 degrees, 100 degrees, 105 degrees, 110 degrees, or any other suitable angles.

Returning to FIG. 4, contacts are formed in the BSG structure and the cell-layers structure (S617). Correspondingly, FIG. 23 illustrates structures at certain stage of the process of forming contacts.

Figure 23:
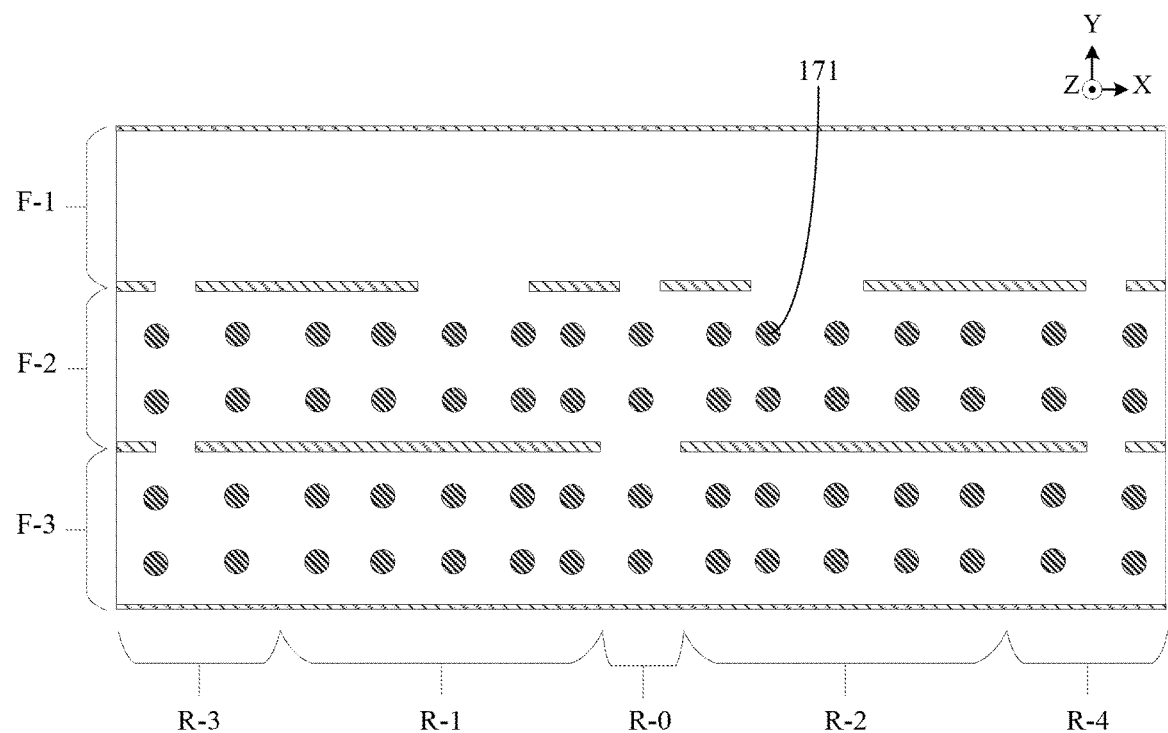
FIG. 23 illustrates structures at certain stage during a process of forming contacts according to various embodiments of the present disclosure.

Referring to FIG. 23, a plurality of contacts 171 may be formed in the second finger region and the third finger region in the region SSR. The plurality of contacts may be formed in region R-0, R-1, R-2, R-3, and R-4 of the second finger region and the third finger region. The plurality of contacts may vertically extend, for example, from a top portion of the cell-layers structure to various depths in the first semiconductor structure 110.

In some embodiments, the contacts 171 may not be formed in the first finger (F-1) region. For example, the wall structure may be formed in the first finger region and may not include contacts formed therein. The wall structure may contain dummy channels (as shown in FIG. 17).

In some embodiments, one or more contacts may extend from a top portion of the cell-layers structure to stairs of word lines in the cell-layers structure. In some embodiments, one or more contacts may extend from a top portion of the cell-layers structure to stairs of bottom select gates in the BSG structure. In some embodiments, one or more contacts may extend from a top portion of the cell-layers structure to the substrate 120, e.g., to the doped well 121.

Returning to FIG. 4, a second semiconductor structure including a back-end-of-line (BEOL) interconnect layer is formed on the first semiconductor structure (S620). Correspondingly, FIG. 24 illustrates an exemplary 3D memory device including a second semiconductor structure on a first semiconductor structure according to various embodiments of the present disclosure.

Figure 24:
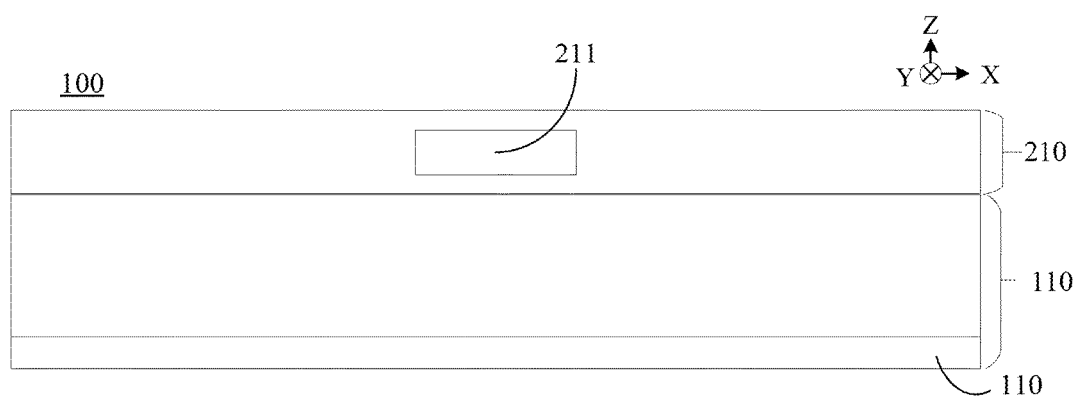
FIG. 24 illustrates an exemplary 3D memory device including a second semiconductor structure on a first semiconductor structure according to various embodiments of the present disclosure.

Referring to FIG. 24, the second semiconductor structure 210 is formed on the first semiconductor structure 110. The first semiconductor structure 110 may include memory cells, stairs for word-lines, contacts, channels, bottom select gates, top select gates, staircases etc. A staircase may include one or more stairs, i.e. stairsteps. The second semiconductor device 210 may include a back-end-of-line interconnect layer 211. Electrical connections may be formed between contacts in the first semiconductor structure 110 and the back-end-of-line interconnect layer 211.

The present disclosure provides a 3D memory device. FIG. 24 illustrates an exemplary 3D memory device 100 according to various embodiments of the present disclosure.

Referring to FIG. 24, the 3D memory device 100 includes a first semiconductor structure 110 and a second semiconductor structure 210. The second semiconductor structure 210 is formed on the first semiconductor structure 110. The first semiconductor structure 110 may include, for example, memory cells, NAND strings, stairs for word lines, contacts, channels, bottom select gates, top select gates, stairs for bottom select gates, stairs for top select gates, etc. The second semiconductor device 210 may include a back-end-of-line interconnect layer 211. Electrical connections may be formed between contacts in the first semiconductor structure 110 and the back-end-of-line interconnect layer 211.

In some embodiments, a finger region, such as a first finger region, a second finger region, or a third finger region, may include one or more rows of NAND strings.

For details of the 3D memory device 100, references can be made to above-descriptions of method embodiments and structures, such as descriptions related to FIGS. 1-23. For example, the first semiconductor structure 110 may include gate-line slits and cut slits as described in related to FIG. 22.

FIG. 25 illustrates another exemplary 3D memory device according to various embodiments of the present disclosure. Referring to FIG. 25, the 3D memory device 100' includes a first semiconductor structure 110' and a second semiconductor structure 210'. The second semiconductor structure 210' is formed on the first semiconductor structure 110'. The first semiconductor structure 110' may include, for example, memory cells, NAND strings, stairs for word lines, contacts, channels, bottom select gates, top select gates, stairs for bottom select gates, stairs for top select gates, etc. The second semiconductor device 210' may include a back-end-of-line interconnect layer 211'. Electrical connections may be formed between contacts in the first semiconductor structure 110' and the back-end-of-line interconnect layer 211'.

Some structures of the 3D memory device 100' may be same as or similar to structures of the 3D memory device 100. For details of the 3D memory device 100', references can be made to above descriptions for method and device embodiments, such as descriptions about the 3D memory device 100.

FIG. 26 illustrates another schematic view of orthogonal projections of gate-line slits and cut slits of a 3D memory device and in a staircase-structure region on the substrate according to various embodiments of the present disclosure. The 3D memory device may be, for example, the 3D memory device 100'.

The cut slits, such as cut-slits 135-1', 135-2', 136-1', 136-2', 137-1', and 137-2', may extend, for example, vertically through a BSG structure of first semiconductor structure 110' and along Z direction from a top of the BSG structure to a portion of a substrate. Accordingly, a cut slit may separate layers, stairs, and/or electrodes in the BSG structure on two sides of the cut slit. That is, layers, stairs, and/or electrodes in the BSG structure on one side of the cut slit are separated from layers, stairs, and/or electrodes in the BSG structure on another side of the cut slit. A plurality of gate-line slits, such as gate-line slits 161', 163', 165', and 167', may, for example, extend vertically through a cell-layers structure and a BSG structure of first semiconductor structure 110' and extend into a portion of the substrate. The gate-line slit 161' may include a plurality of gate line sub-slits 161-1', 161-2', 161-3', 161-4', 161-5', and 161-6'; and the gate-line slit 163' may include gate line sub-slits 163-1', 163-2' 163-3', and 163-4'.

In some embodiments, an orthogonal projection of a cut slit, such as the cut slit 136-1', on the substrate, may include one or more line segments. In some embodiments, an orthogonal projection of a cut slit, such as the cut slit 135-1', on the substrate, may include one or more curve segments. In some embodiments, an orthogonal projection of a cut slit, such as the cut slit 135-2', on the substrate, may include one or more zig-zag segments. In some embodiments, an orthogonal projection of a cut slit on the substrate may include one or more line segments and one or more curve segments. In some embodiments, an orthogonal projection of a cut slit may include any combination of the above-described shapes and/or any other suitable shapes.

In some embodiments, cut slits on two sides of a central plane O1-O2 may be asymmetric with respect to the central plane O1-O2. For example, cut slits 136-1' and 136-2' are asymmetric with respect to the central plane O1-O2. The distance from the cut slit 136-1' to the central plane O1-O2 is different from the distance from the cut slit 136-2' to the central plane O1-O2. A lateral length of the cut slit 136-1' is different from a lateral length of the cut slit 136-2'.

As another example, cut slits 135-1' and 135-2' are asymmetric with respect to the central plane O1-O2. A shape of the cut slit 135-1' is different from a shape of the cut slit 135-2'.

In some embodiments, gate-line slits or gate-line sub-slits on two sides of the central plane O1-O2 may be asymmetric with respect to the central plane O1-O2. For example, gate-line sub-slits 161-3' and 161-4' are asymmetric with respect to the central plane O1-O2. The distance from the gate-line sub-slit 161-3' to the central plane O1-O2 is different from the distance from the gate-line sub-slit 161-4' to the central plane O1-O2. A lateral length of the gate-line sub-slit 161-3' is different from A lateral length of the gate-line sub-slit 161-4'.

The present disclosure provides a central driver structure. The central driver structure may include a structure in the staircase-structure region of a three-dimensional memory device consistent with the present disclosure, such as a staircase-structure region in the above descriptions. The present disclosure provides a method for a central driver structure. For details of the method for the central driver structure, references can be made to above descriptions, such as descriptions associated with FIG. 4.

Although the principles and implementations of the present disclosure are described by using specific embodiments in the specification, the foregoing descriptions of the embodiments are only intended to help understand the method and core idea of the method of the present disclosure. Meanwhile, a person of ordinary skill in the art may make modifications to the specific implementations and application range according to the idea of the present disclosure. In conclusion, the content of the specification should not be construed as a limitation to the present disclosure.

What is claimed is:

1. A method for forming a memory device, comprising:
   forming a bottom-select-gate (BSG) structure on a substrate;
   forming cut slits vertically through the BSG structure on the substrate;
   forming a cell-layers structure on the BSG structure; and
   forming gate-line slits that are vertically through the cell-layers structure and the BSG structure, into the substrate and arranged along a first lateral direction to distinguish a plurality of finger regions, wherein:
   the gate-line slits include a first gate-line slit between first and second finger regions of the plurality of finger regions, the first gate-line slit including gate-line sub-slits, and
   the cut slits include a first cut-slit, formed in the second finger region and connecting to a gate-line sub-slit of the first gate-line slit to define a BSG in a first portion of the second finger region, wherein:
   the BSG in the first portion of the second finger region is electrically connected to cell strings in the first finger region through an inter portion between the one gate-line sub-slit and an adjacent gate-line sub-slit of the first gate-line slit.

2. The method according to claim 1, wherein:
the first cut-slit electrically separates the BSG in the first portion of the second finger region from a BSG in a second portion of the second finger region.

3. The method according to claim 2, wherein:
the BSG in the second portion of the second finger region is electrically connected to cell strings in the second finger region.

4. The method according to claim 3, wherein:
the BSG in the first portion of the second finger region and the BSG in the second portion of the second finger region have a same height from the substrate.

5. The method according to claim 1, wherein:
the cut slits further include one or more second cut-slits, each connecting adjacent gate-line sub-slits in a same gate-line slit.

6. The method according to claim 1, further including:
forming dummy channels in the plurality of finger regions over the substrate; and
forming contacts on BSGs in the plurality of finger regions excluding the first finger region.

7. The method according to claim 1, wherein:
the first finger region is defined between a continuous gate-line slit and the first gate-line slit including the gate-line sub-slits, and
a wall structure is formed in the first finger region over the substrate, wherein the wall structure includes a stack structure of alternating electrode/insulating layer pairs.

8. The method according to claim 1, wherein:
an orthogonal projection of the cut slits on the substrate includes straight-line segments.

9. The method according to claim 1, further including:
forming another BSG structure, wherein:
the substrate includes a staircase-structure region and a doped well is formed in the staircase-structure region of the substrate, and
the BSG structure and the another BSG structure are formed on the staircase-structure region of the substrate and on opposite sides of the doped well.

10. The method according to claim 9, wherein:
a top of the BSG structure and a top of the another BSG structure have different heights from the substrate.

11. The method according to claim 9, wherein:
the substrate further includes a first array region and a second array region, and
the staircase-structure region is between the first array region and the second array region, arranged along a second lateral direction.

12. The method according to claim 1, wherein:
the cell-layers structure includes a stack structure of alternating sacrificial layer/insulating layer pairs before forming the gate-line slits.

13. The method according to claim 1, wherein:
a word line in the second finger region over the BSG structure is connected to an electrode layer in the first finger region through the inter portion between the one gate-line sub-slit and the adjacent gate-line sub-slit of the first gate-line slit.

14. The method according to claim 1, further including:
depositing an insulating material in the cut slits.

* * * * *